(12) United States Patent
Tsuchiaki

(10) Patent No.: US 7,094,693 B2
(45) Date of Patent: Aug. 22, 2006

(54) METHOD OF MANUFACTURING SEMICONDUCTOR DEVICE AND SEMICONDUCTOR DEVICE

(75) Inventor: Masakatsu Tsuchiaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 10/947,381

(22) Filed: Sep. 23, 2004

(65) Prior Publication Data

US 2005/0202663 A1 Sep. 15, 2005

(30) Foreign Application Priority Data

Mar. 11, 2004 (JP) ............................. 2004-068915

(51) Int. Cl.
*H01L 21/4763* (2006.01)
*H01L 21/3205* (2006.01)

(52) U.S. Cl. ..................... 438/682; 438/197; 438/597

(58) Field of Classification Search ................ 438/197, 438/597, 682, 795
See application file for complete search history.

(56) References Cited

U.S. PATENT DOCUMENTS 5,994,210 A * 11/1999 Kerr ........................... 438/592

| | | | | |
|---|---|---|---|---|
| 6,713,333 B1 * | 3/2004 | Mayuzumi | ................. | 438/197 |
| 2002/0146904 A1 * | 10/2002 | Buynoski et al. | ........... | 438/682 |
| 2004/0266194 A1 * | 12/2004 | Iinuma | ....................... | 438/694 |
| 2005/0250317 A1 * | 11/2005 | Koh et al. | .................. | 438/653 |

FOREIGN PATENT DOCUMENTS

| JP | 11-111980 | 4/1999 |
|---|---|---|
| JP | 11-214328 | 8/1999 |

* cited by examiner

*Primary Examiner*—Alexander Ghyka
(74) *Attorney, Agent, or Firm*—Oblon, Spivak, McClelland, Maier & Neustadt, P.C.

(57) ABSTRACT

Disclosed is a semiconductor device of n-type MOSFET structure, which comprises a semiconductor substrate having a device isolation region, diffusion regions formed in the semiconductor substrate, gate electrodes formed above the semiconductor substrate, and a F-containing NiSi layer formed on the diffusion regions and containing F atoms at a concentration of $3.0 \times 10^{13}$ $cm^{-2}$ or more in areal density, wherein a depth from the junction position formed between the diffusion region and the semiconductor substrate to the bottom of the F-containing NiSi layer is confined within the range of 20 to 100 nm, and the concentration of F atoms at an interface between the F-containing NiSi layer and the semiconductor substrate is $8.0 \times 10^{18}$ $cm^{-3}$ or more.

10 Claims, 13 Drawing Sheets

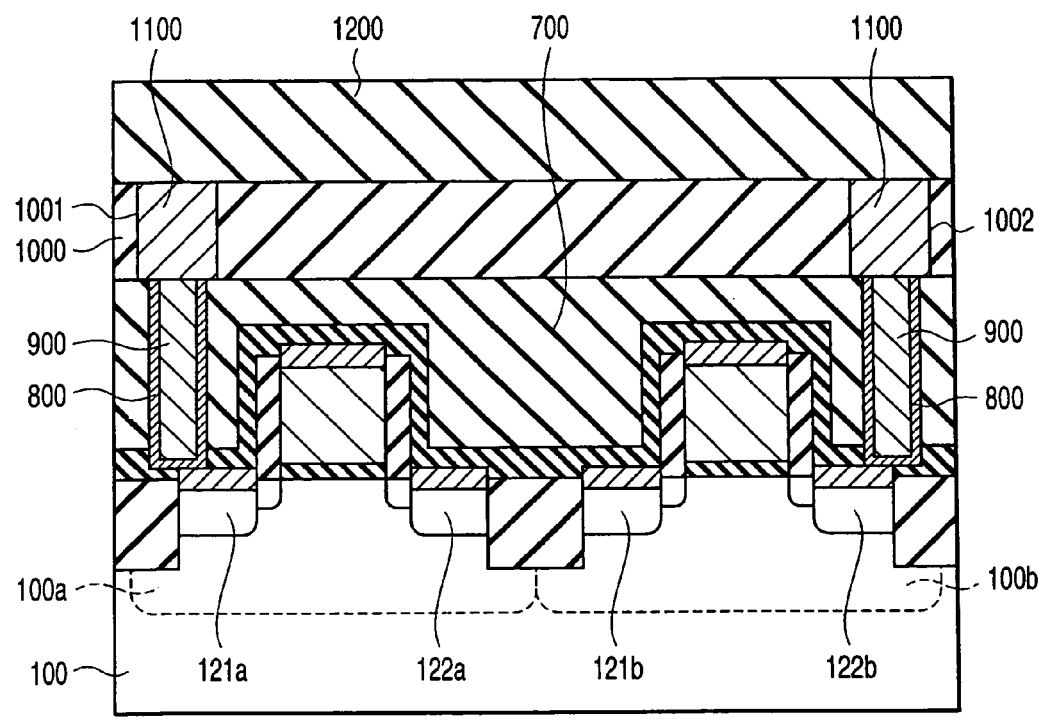
F I G. 17
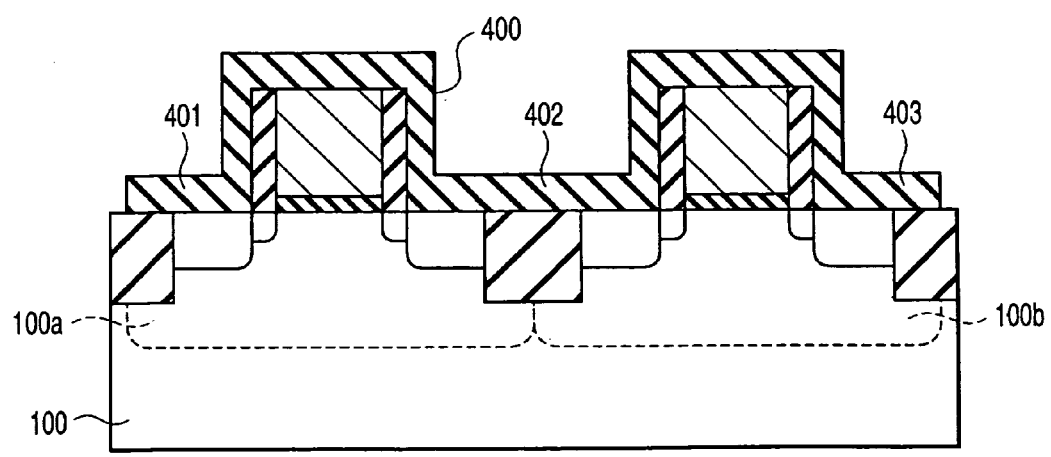
F I G. 18

METHOD OF MANUFACTURING SEMICONDUCTOR DEVICE AND SEMICONDUCTOR DEVICE

CROSS-REFERENCE TO RELATED APPLICATIONS

This application is based upon and claims the benefit of priority from prior Japanese Patent Application No. 2004-068915, filed Mar. 11, 2004, the entire contents of which are incorporated herein by reference.

BACKGROUND OF THE INVENTION

1. Field of the Invention

The present invention related to a method for manufacturing a semiconductor device and to a semiconductor device. In particular, the present invention relates to a method for manufacturing a high-speed low-power field effect transistor having silicide source and drain electrodes (hereinafter referred to as MOSFET).

2. Description of the Related Art

To minimize the electrical resistance of the source and drain electrodes of a MOSFET, a method has been proposed wherein an upper portion of source/drain region is reacted with a metal such as Co, Ti or Ni (to form silicides thereof). However, these metal atoms are prone to rapidly diffuse into a silicon substrate during the silicide formation or in a subsequent step of heat treatment. Accordingly, when a shallow junction is formed in the source/drain region, the metals thus diffused can reach the junction, thus giving rise to leakage at the junction.

To suppress junction leakage associated with Co silicidation, $N_2$ implantation prior to $CoSi_2$ formation is proposed. However, in order to achieve sufficient leakage suppression, high dose $N_2$ implantation more than $1 \times 10^{15}$ cm$^{-2}$ is required. Since N (nitrogen) is an n-type impurity in a silicon substrate, if such a high dose of $N_2$ is implanted, the impurity concentration of the source/drain region of a p-type MOSFET will be compensated or disrupted by the n-type impurity thus ion-implanted. Therefore, pre-silicide ion-implantation of $N_2$ is not suited for manufacturing a CMOS circuit.

There has been also proposed the measures wherein F (fluorine) is ion-implanted in order to selectively reduce the reaction speed of $TiSi_2$ formation on the source/drain region where F is implanted exclusively, thereby resulting in a thin $TiSi_2$ on the source/drain region compared to $TiSi_2$ formed on a gate electrode, thus, suppressing the generation of junction leakage, while maintaining thick $TiSi_2$ on the gate electrode. Also, regarding to the F implantation prior to $TiSi_2$ formation, creation of a gettering region by presilicide F implantation is proposed to trap Ti-containing metal impurities that might be released in the process of $TiSi_2$ formation, thereby suppressing junction leakage.

Besides $CoSi_2$ and $TiSi_2$, regarding to NiSi, it has been found out by the present inventor that thermal instability of NiSi induces substantial leakage current even after a heat treatment as low as 500° C. It has been also found out that, unless the annealing temperature is lowered below 450° C., the leakage generation cannot be avoided. Notably, however, LSI fabrication below such a low temperature of 450° C. may significantly reduce the throughput of the production and, thus, impair manufacturability of the devices and impose cost disadvantage.

As explained above, no one has yet succeeded in finding a stable and cost-efficient method for NiSi formation, which is capable of fully securing the advantages of silicide formation without suffering associated disadvantages such as junction leakage generation or severe restriction on the fabrication temperature.

BRIEF SUMMARY OF THE INVENTION

According to one aspect of the present invention, there is provided a method for manufacturing a semiconductor device, the device comprising MOSFET structure having an F-containing NiSi layer formed on diffusion regions and on gate electrodes, a depth from the bottom of the F-containing NiSi layer to the junction position of the diffusion regions being confined within the range of 20 to 100 nm, the method comprising: forming the gate electrodes above a semiconductor substrate with a gate insulation film being interposed between the semiconductor substrate and the gate electrodes; forming the diffusion regions by introducing an impurity into the semiconductor substrate with the gate insulating film and the gate electrodes being employed as a mask; forming a F-containing layer on a surface layer of a silicide-forming region by ion-implanting F atoms at a dosage of $8.0 \times 10^{13}$ cm$^{-2}$ or more in the silicide-forming region of silicon for forming the silicide; depositing a Ni film on the F-containing layer without heat-treating the F-containing layer; heat-treating the Ni film to turn the silicon of the silicide-forming region into NiSi, thereby forming the F-containing NiSi layer on diffusion regions and on gate electrodes; and subjecting the F-containing NiSi layer to a heat treatment for a period of time equal to or shorter than, an allowable duration defined as a function of junction depth and temperature by the following formula (A):

$$t_a = Dj^2 / \text{Exp}(34.7 - 2.35 \times 10^4 / Ta) + 68 \tag{A}$$

(wherein $t_a$ is the allowable duration (minutes); Dj is a depth (nm) of the position of junction as measured from the bottom of the NiSi layer; and Ta is a heat treatment temperature (K: Kelvin)).

According to another aspect of the present invention, there is provided a semiconductor device of n-type MOSFET structure comprising: a semiconductor substrate having a device isolation region; diffusion regions formed in the semiconductor substrate; gate electrodes formed above the semiconductor substrate; and a F-containing NiSi layer formed on the diffusion regions and containing F atoms at a concentration of $3.0 \times 10^{13}$ cm$^{-2}$ or more in areal density, a depth from the junction position formed between the diffusion region and the semiconductor substrate to the bottom of the F-containing NiSi layer being in the range of 20 to 100 nm; and the concentration of F atoms at an interface between the F-containing NiSi layer and the semiconductor substrate being $8.0 \times 10^{18}$ cm$^{-3}$ or more.

BRIEF DESCRIPTION OF THE SEVERAL VIEWS OF THE DRAWING

FIG. 17 is a cross-sectional view illustrating one step to be performed subsequent to the step shown in FIG. 15;

FIG. 18 is a cross-sectional view illustrating one of the steps in the manufacturing method of a semiconductor device according to Embodiment 2;

DETAILED DESCRIPTION OF THE INVENTION

Next, the embodiments of the present invention will be illustrated with reference to drawings.

Figure 1:
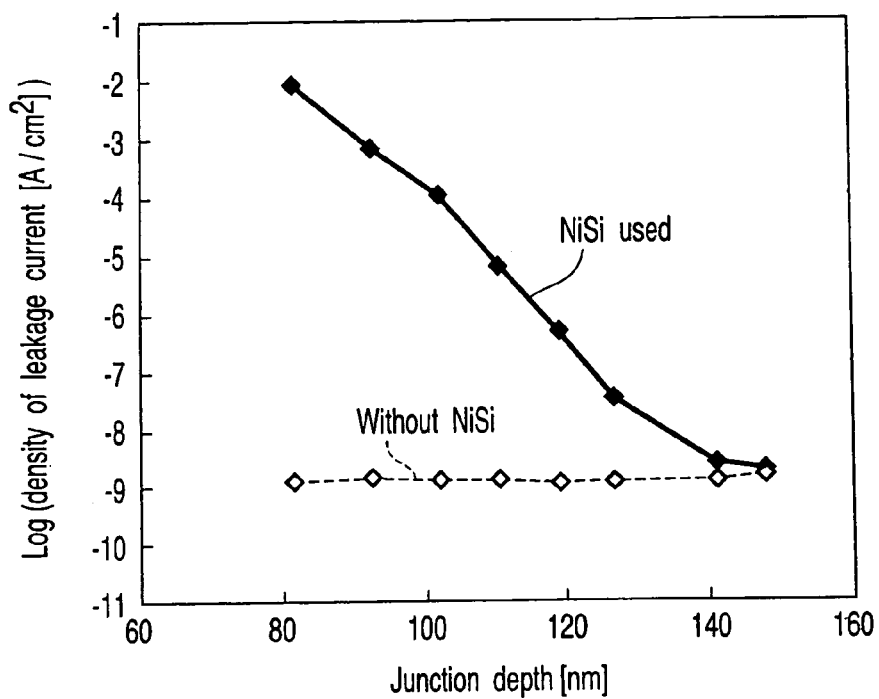
FIG. 1 shows leakage levels as functions of junction depths for a conventional junction with NiSi and a junction without silicide.

First of all, the relationship between the depth of the junction and the leakage current density in a semiconductor device where an NiSi layer is formed on the diffusion regions thereof will be illustrated in a graph shown in FIG. 1. The graph of FIG. 1 also shows the relationship between the depth of the junction and the leakage current density where an NiSi layer is not formed on the diffusion regions thereof.

In order to obtain depth profiles, $n^+/p$ junction with various depths were prepared. Then, Ni was deposited and heat-treated for 30 seconds at 450° C. in a nitrogen gas to form 30 nm-thick NiSi layers on the junctions. The resulting NiSi layers were further post-annealed for 90 minutes at a temperature of 500° C. From FIG. 1, measurable leakage generation even at a depth of 140 nm is already in evidence although it is far deeper than the NiSi thickness of 30 nm. It should be also noted that the annealing temperature of 500° C. is far lower than the transition temperature (750° C.) of the NiSi to $NiSi_2$. It has been found by the present inventor that the thermal instability of NiSi induces release of Ni atoms from the NiSi layer. And ensuing diffusion and migration of Ni atoms deep into the Si substrate during the aforementioned heat treatment is identified as a root cause of the leakage generation. These findings are explained later in detail.

It is also found that Ni infiltration into the Si substrate can be prevented by limiting process temperatures after NiSi formation below 450° C. However, severe restriction of the process temperatures below such a low temperature causes various problems for LSI mass-production. For example, it may become difficult to form a sufficiently dense and uniform barrier layer or an etching-stopper layer (i.e., a liner layer, usually composed of silicon nitride) directly over the NiSi layer below such a low temperature. In addition, without a high temperature annealing, it may become difficult to secure an adequate electric contact between the NiSi layer at the bottom of a small-sized contact hole and a metal wiring thereon.

The aforementioned liner layer, directly deposited over the NiSi, should serve as a barrier layer during a subsequent interlayer formation to keep undesirable impurities from reaching the NiSi. It should also act as an etching-stopper layer during ensuing contact hole etching through the interlayer to prevent the etching from directly attacking the underlying NiSi and penetrating it. Therefore, the silicon nitride film as a liner layer must be sufficiently high in density and adequately uniform in thickness. Nonetheless, if the liner layer is to be deposited below 450° C., the deposition rate of the nitride film would become very slow (thus reducing throughput and productivity of the manufacturing), and at the same time, the density and uniformity of the film would be deteriorated (thus making it impossible to obtain a proper function of a liner layer).

Furthermore, after completion of contact holes by a subsequent short time etching through the remaining liner layer to finally expose NiSi, a thin oxide tends to be formed over the NiSi. In order to secure a good electrical contact between the NiSi layer and a wiring metal deposited over it, the contact need to be annealed at a temperature of around 500° C., so that the thin oxide between the NiSi layer and the wiring metal is thermally disintegrated. If the temperature of heat treatment is limited to less than 450° C., the oxide may remain intact, thereby impairing proper electrical contacts between devices, nullifying the merit of silicide formation, and hence, lowering the yield and productivity of the manufacturing.

Considering the above arguments, it is clear that improvement of NiSi thermal stability against a heat treatment at around 500° C. and prevention of associated leakage generation will bring great benefit for LSI fabrication in terms of device performance, manufacturability, yield and productivity.

As a first step to achieve this improvement, the way of Ni infiltration and migration into the Si substrate during a 500° C. annealing was carefully monitored. In addition, the Ni depth profiles thus obtained are correlated with leakage-depth profiles in FIG. 2.

Figure 2:
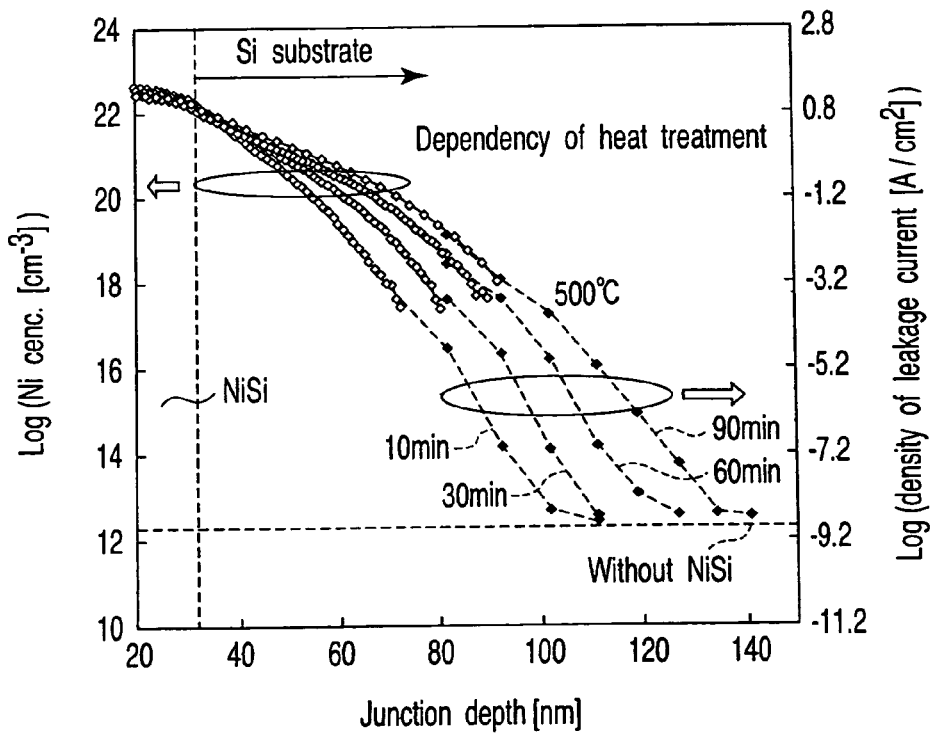
FIG. 2 shows correlation between leakage-depth profiles (right axis, logarithmic scale) and Ni concentration-depth profiles (left axis, logarithmic scale) after thermal annealing at 500° C. for up to 90 min. Excellent matching of the profiles unequivocally proves that diffused Ni inside Si substrate is the direct source of the leakage generation.

In order to obtain leakage-depth profiles, pn junctions with various depths were prepared. Following, a Ni film was deposited and annealed by a rapid thermal annealing (RTA) at 450° C. in nitrogen ambient to form a 30 nm-thick NiSi layer. The resultant junctions were further post-annealed at 500° C. for up to 90 min (i.e. for 10 minutes, 30 minutes, 60 minutes and 90 minutes). The temperature ramping rate of the post-annealing was set to 100° C./min. Finally, by measuring the leakage current density of each junction of various depth, leakage-depth profiles were readily obtained. In FIG. 2, the density of junction leakage current (right vertical axis) was plotted as a function of junction depth after each heat treatment condition.

In order to obtain Ni depth-profiles, backside SIMS method was employed. This backside SIMS method is a technique wherein the SIMS analysis is performed from the backside (i.e., the opposite side of the surface where NiSi is formed), thereby making it possible to determine an accurate concentration of Ni in the Si substrate without the so-called "knocking" from the NiSi surface. In FIG. 2, the depth distribution of Ni concentration in the Si substrate (left vertical axis) after each heat treatment was plotted.

As shown in FIG. 2, almost exact matching is obtained between leakage-depth profiles and Ni depth profiles regardless of the annealing conditions. This finding unequivocally proves that the leakage generation was caused by the Ni atoms migrated into the Si substrate during the heat treatment. It entails that, in order to suppress junction leakage, the thermal stability of NiSi must be improved and Ni infiltration and migration into Si substrate must be blocked. This finding also contrasts sharply with the conventional belief that the leakage current associated with silicidation is produced only when a silicide layer penetrates source/drain junction. Substantial leakage can be generated far before the silicide layer reaches the junction depth, due to highly migrant Ni atoms liberated from thermally instable NiSi/Si interface.

Figure 3:
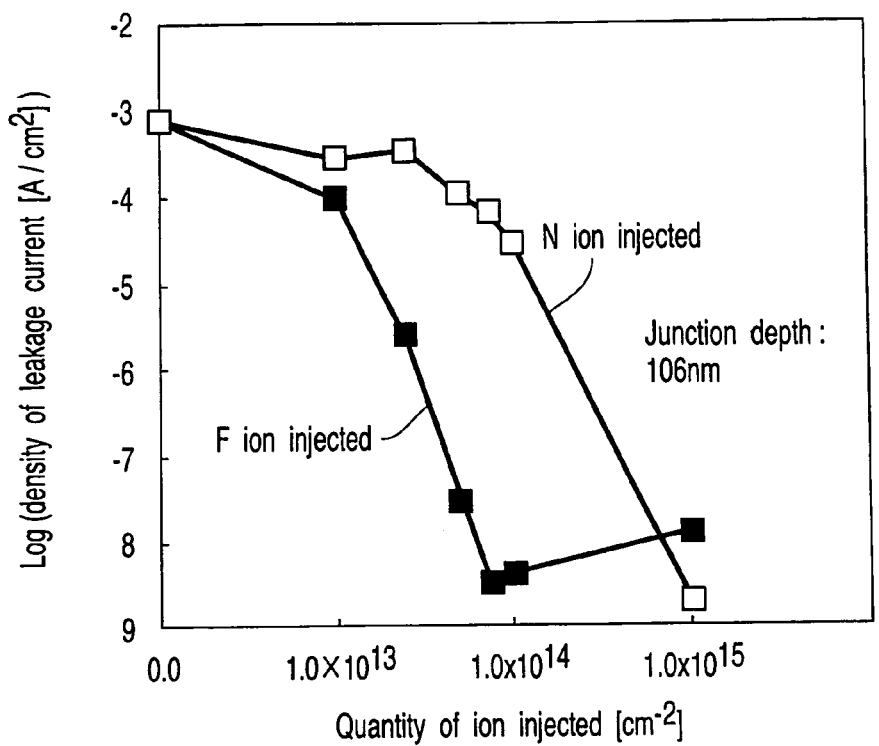
FIG. 3 shows leakage levels as functions of pre-silicide implantation dosage of F and N.

Now that it is clear that leakage suppression and high yield device fabrication are only attainable through thermally stable NiSi, as a way to enhance thermal stability of NiSi, effects of ion implantation of F atoms or N atoms into the surface of the Si substrate prior to NiSi formation were examined. The dosage of the implantation was varied from $1.0 \times 10^{13}$ cm$^{-2}$ to $1.0 \times 10^{15}$ cm$^{-2}$ and implantation energy was set to 2 keV. After NiSi formation, post-annealing for 90 minutes at 500° C. was applied to the substrate and leakage currents through pn junctions were measured. FIG. 3 shows junction leakage current density as a function of pre-silicide implantation dosage at a junction depth of 106 nm.

For N implantation, modest leakage reduction by two orders of magnitude was observed at a dosage of $1.0 \times 10^{14}$ cm$^{-2}$. By contrast, far greater leakage suppression by more than 5 orders of magnitude was attained with F implantation at the same dosage. The efficiency of leakage suppression by F implantation seems to reach a maximum at a dosage of about $1.0 \times 10^{14}$ cm$^{-2}$. Obviously, in order to emulate the same level of leakage suppression with N implantation, 10 times higher dosage, namely, $1.0 \times 10^{15}$ cm$^{-2}$ is required.

Figure 4:
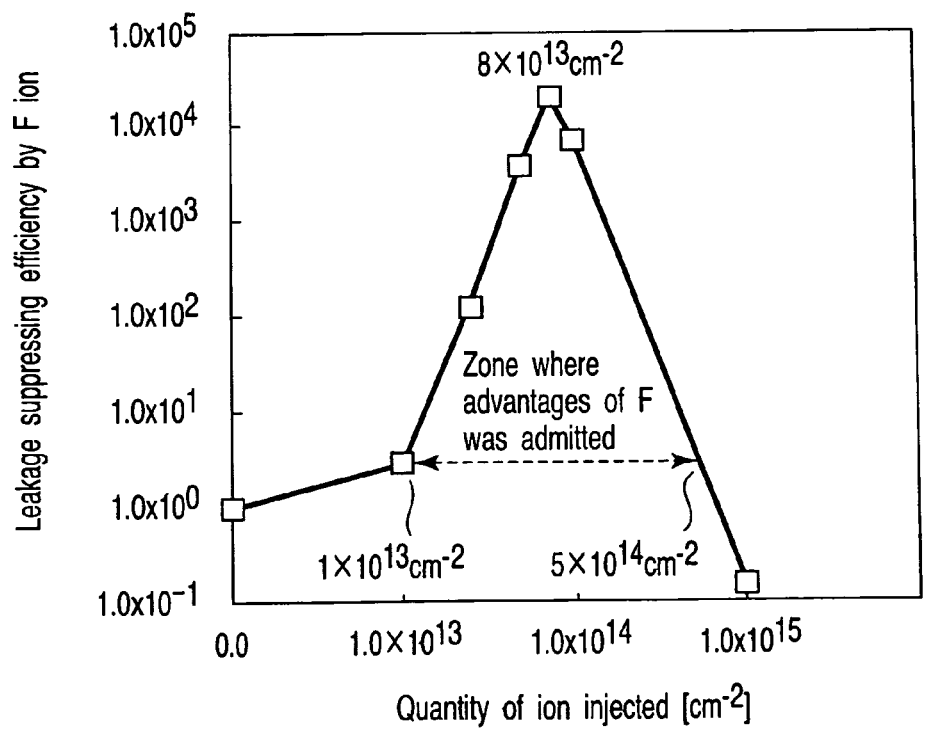
FIG. 4 shows the leakage suppressing efficiency as a function of implantation dose of F.

FIG. 4 shows the leakage suppression efficiency defined as leakage with N implantation divided by leakage with F implantation at the same dosage. Within the dosage range from $1.0 \times 10^{13}$ cm$^{-2}$ to $5.0 \times 10^{15}$ cm$^{-2}$, clearly, F implantation was more than twice as efficient as N implantation. In addition, the efficiency with F implantation has a maximum at about $8.0 \times 10^{13}$ cm$^{-2}$.

Figure 5:
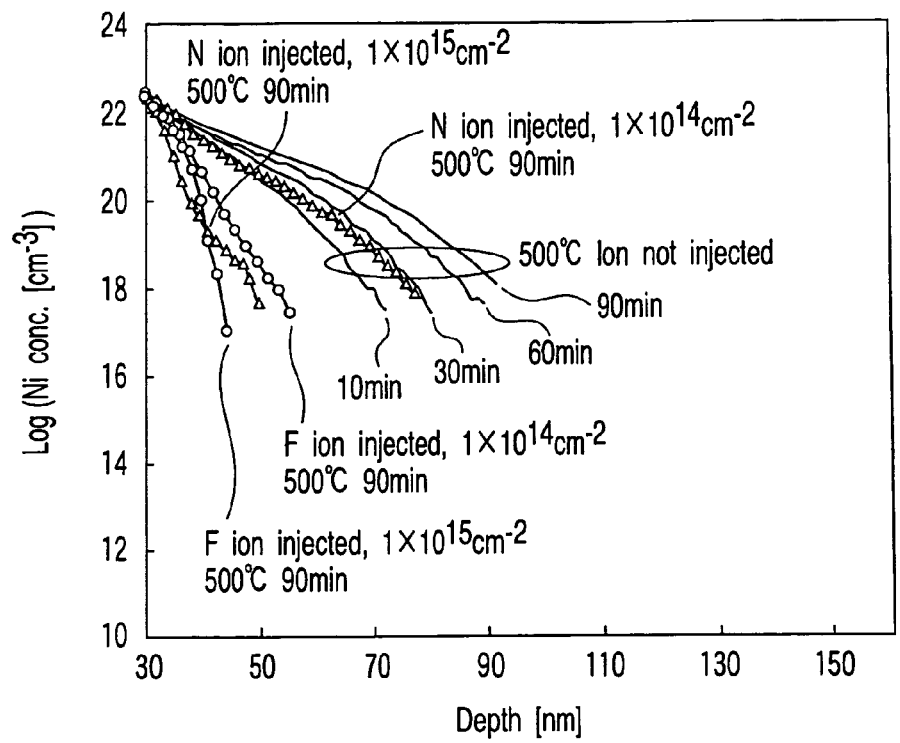
FIG. 5 shows Ni depth-profiles for various junctions implanted with F and N after 500° C. annealing for 90 min. For reference, Ni depth profiles after 500° C. annealing for up to 90 min is plotted for junctions without pre-silicide implantation.

In order to confirm that the observed leakage suppression is a genuine result of reduction of Ni migration into the Si substrate, Ni depth profiles were measured. After pre-silicide implantation of F or N at a dosage of $1.0 \times 10^{14}$ cm$^{-2}$ and $1.0 \times 10^{15}$ cm$^{-2}$ and subsequent NiSi formation, a post-annealing for 90 minutes at 500° C. was applied. Ni depth profiles were measured by the backside SIMS method and shown in FIG. 5. For comparison, Ni depth profiles for no-implantation samples (i.e., reference samples) after 10 minutes, 30 minutes, 60 minutes and 90 minutes annealing at 500° C. are also shown in FIG. 5.

With N implantation at $1.0 \times 10^{14}$ cm$^{-2}$ dosage, although a limited reduction of Ni diffusion is visible, still a large amount of Ni atoms migrate into Si substrate. To suppress the leakage, it is preferable that the concentration of the Ni atoms at the junction depth is kept below $1.0 \times 10^{14}$ cm$^{-3}$. Apparently, in order to achieve the criterion for a junction shallower than 100 nm, N implantation with more than $1.0 \times 10^{15}$ cm$^{-2}$ dosage is required. With F implantation, however, even a dosage as low as $1.0 \times 10^{14}$ cm$^{-2}$ can achieve the same level of reduction of Ni migration, which is otherwise attainable only by high dose N implantation of more than $1.0 \times 10^{15}$ cm$^{-2}$. The observed disparity between F and N in the efficiency for Ni migration reduction is completely in agreement with the dependency of leakage suppression on the implantation ions and dosage as shown in FIG. 3.

One may notice that, although slightly better reduction of Ni migration is observed for F implantation with $1.0 \times 10^{15}$ cm$^{-2}$ compared to $1.0 \times 10^{14}$ cm$^{-2}$, the leakage current slightly increases with the higher dosage as shown in FIG. 3. This minor increase of the leakage current can be ascribed to defects induced in the Si substrate by the implantation itself. Thus, in practice, to prevent the defect generation in the Si substrate, the implantation dosage is better to be limited to less than $1.0 \times 10^{15}$ cm$^{-2}$.

Figure 6:
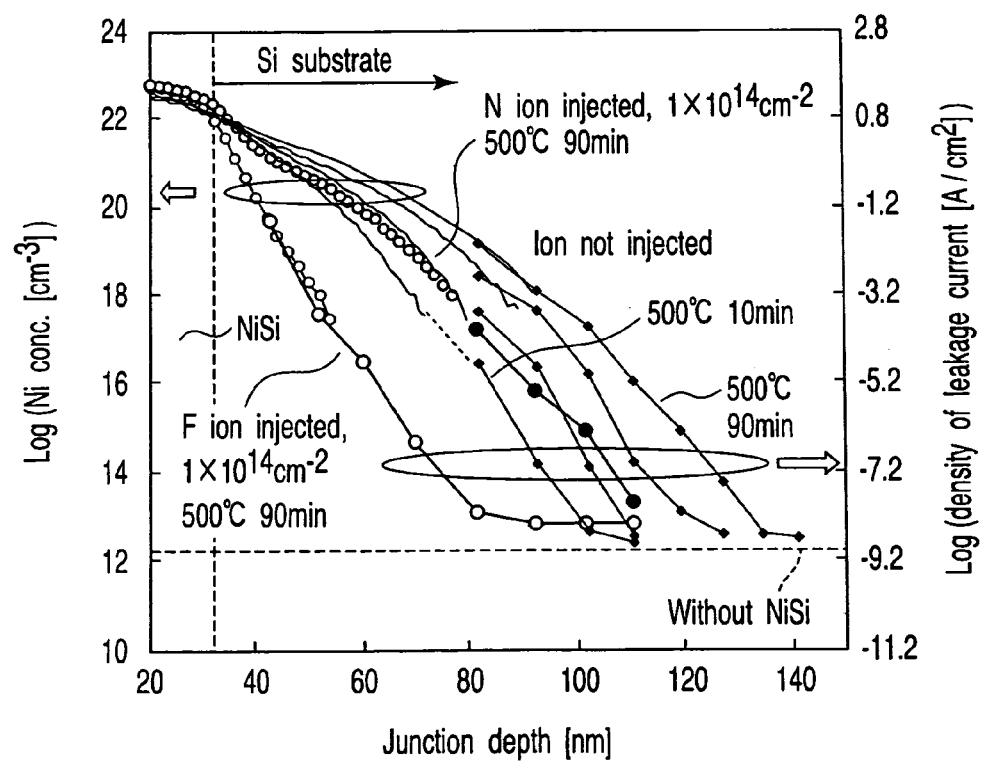
FIG. 6 shows correlation between leakage-depth profiles (right axis, logarithmic scale) and Ni concentration-depth profiles (left axis, logarithmic scale) for junctions with pre-silicide implantation of F and N after thermal annealing at 500° C. for 90 min. For reference, correlation for no-implanted junctions as shown in FIG. 2 is also reproduced. Excellent matching of the profiles undoubtedly proves that the leakage suppression by pre-silicide implantation is achieved by suppressing Ni migration inside Si.

In order to further confirm correspondence between Ni migration reduction and junction leakage suppression by the pre-silicide implantation, Ni depth profiles after $1.0 \times 10^{14}$ cm$^{-2}$ implantation of F and N (left axis) are correlated with leakage-depth profiles of corresponding junctions (right axis) in FIG. 6. For comparison, reference data for no-implantation samples after 500° C. post-annealing for 10 minutes, 30 minutes, 60 minutes and 90 minutes are also included. Excellent matching between Ni depth profiles and leakage-depth profiles is obtained regardless of the pre-silicide implantation conditions and annealing time. The matching speaks for itself. Pre-silicide implantation, especially F implantation, enhances the thermal stability of NiSi, reduces release of Ni atoms from the NiSi layer, retards Ni migration deep into the silicon substrate, and thereby suppresses the leakage generation.

Regarding to the reference data, Ni infiltration after initial 10 min annealing looks disproportionately deep compared to the 30, 60, 90 min data (i.e., a Ni depth profile at 0 min extrapolated from these data does not seem to converge to the initial NiSi/Si interface). It means that, at an early stage of the annealing, substantial amount of Ni must have burst into Si substrate. This "initial Ni burst" during annealing is quite detrimental to stable LSI fabrication with NiSi because even a very short heat stimulus need to be avoided to suppress Ni infiltration. Notably, however, this detrimental Ni burst is efficiently eliminated by pre-silicide F implantation as seen from FIG. 6.

Actually, it has been found from the more detailed analysis of these data that F injection can withhold Ni infiltration into Si substrate at least for 68 minutes. Also, from a detailed analysis of the Ni migration kinematics in the Si substrate, it has been found that an effective diffusion coefficient of Ni (considered to be clustering as a leakage source) was 62 nm$^2$/min at 500° C. and the activating energy thereof was 2.03 eV.

Integrating all the above findings, the present inventor has successfully formulated a largest allowable duration for effective leakage suppression by pre-silicide F implantation as a function of junction depth and annealing temperature for junctions deeper than 20 nm.

The allowable duration $t_a$ (minutes) can be expressed by the following formula (A), $$t_a = Dj^2/\text{Exp}(34.7 - 2.35 \times 10^4/Ta) + 68 \quad (A)$$

(where, Dj (nm) is a junction depth measured from the bottom of the NiSi layer (should be larger than 20 nm) and Ta (K: Kelvin or absolute temperature, larger than ° C. by 273) is heat treatment temperature.)

As long as the duration is confined within the duration as defined by the above formula (A), there is no possibility of generating the junction leakage that may be caused by the thermal instability of the Nisi layer. Here, it should be also noted that, for fabrication processes with multiple heat treatments, the highest temperature in the processes should be taken as Ta. Because NiSi thermal stability improves drastically with the decrease of the process temperature, a practical limit on the annealing time can be derived from the highest process temperature among the heat processes.

Figure 7:
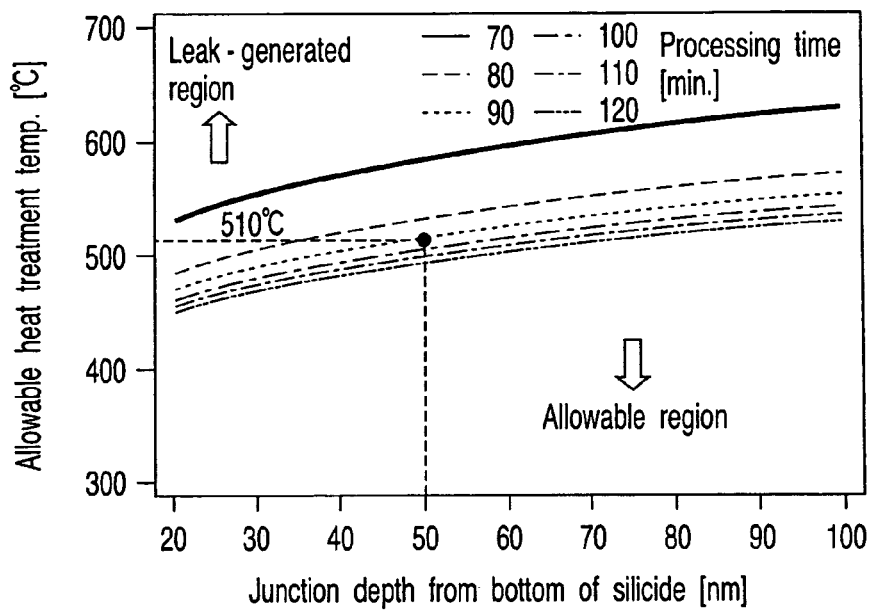
FIG. 7 plots allowable heat treatment temperatures as functions of the junction depths for various annealing time.

Of course, the formula (A) can be used in other way around. The largest allowable heat treatment temperature Ta can be obtained as a function of the allowable duration $t_a$ and junction depth Dj by finding a value which satisfies the formula (A) with the given ta and Dj. FIG. 7 illustrates the largest allowable heat treatment temperature as a function of the allowable duration $t_a$ and junction depth Dj. Herein, the largest allowable heat treatment temperature was calculated for the allowable duration ($t_a$) from 70 to 120 minutes and junction depth (Dj, measured from the bottom of the NiSi layer) in the range of 20 to 100 nm.

It will be clear from FIG. 7 that, even for Dj=50 nm (i.e., assuming 30 nm-thick NiSi layer, the junction depth as measured from the surface is about 80 nm), unlike no-implantation reference sample, a leakage-free annealing at 500° C. for 90 minutes is allowed thanks to the pre-silicide F implantation.

Although the formula (A) is derived from the data of pre-silicide F implantation with $1.0 \times 10^{14}$ cm$^{-2}$ dosage, the following arguments should be noted regarding to the validity of the formula (A). As already explained above with reference to FIG. 5, the thermal stability of the NiSi layer improves with the increase of F dosage. Thus, as long as F dosage is set to $1.0 \times 10^{14}$ cm$^{-2}$ or more, the aforementioned formula (A) is applicable. Furthermore, as shown in FIG. 3, at the F dosage of $8.0 \times 10^{13}$ cm$^{-2}$, the leakage suppression efficiency thereof is better than that can be achieved by the F implantation of $1.0 \times 10^{14}$ cm$^{-2}$. Thus, it will be understood that as long as the F dosage is $8.0 \times 10^{13}$ cm$^{-2}$ or more, the aforementioned formula (A) is applicable.

Regarding to the implantation ions, apparently, F ions have a sufficient leakage suppressing effect even with a low dosage of $1.0 \times 10^{14}$ cm$^{-2}$ or less. In the case of N ions, however, it would be required to inject N ions over a dosage of $1.0 \times 10^{15}$ cm$^{-2}$ to obtain the same degree of leakage suppressing effect. Since N ion is an n-type impurity in Si, a high dosage N implantation more than $1.0 \times 10^{15}$ cm$^{-2}$ is not applicable to a p-type MOSFET. On the other hand, F is electrically inactive in Si. Furthermore, F is efficient enough to achieve a sufficient leakage suppressing effect with a dosage of as low as $8.0 \times 10^{13}$ cm$^{-2}$. Therefore, F ions are very suitable for suppressing junction leakage of a C-MOSFET circuit (i.e., a circuit made of both n-type and p-type MOSFET's).

Figure 8:
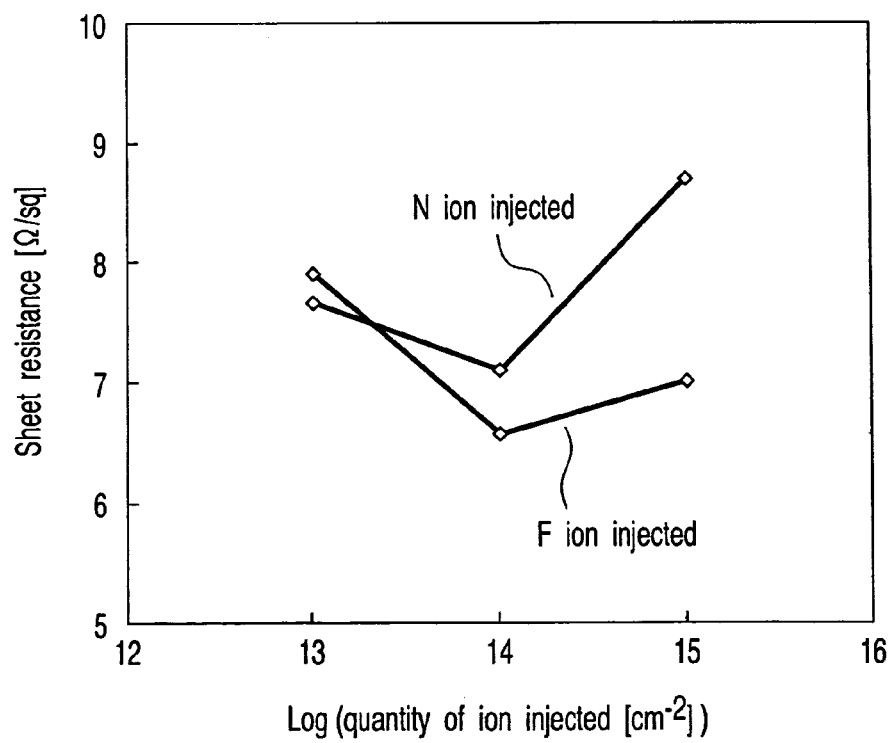
FIG. 8 shows sheet resistances of NiSi layers as functions of implantation dosage of F and N.

Besides the leakage suppression, impacts of F or N pre-silicide implantation on the electrical resistivity of the subsequently formed NiSi layer were also investigated. After pre-silicide F or N implantation with energy of 2 keV and at dosages of $1.0 \times 10^{13}$ cm$^{-2}$, $1.0 \times 10^{14}$ cm$^{-2}$ and $1.0 \times 10^{15}$ cm$^{-2}$, a 30 nm-thick NiSi was formed and post-annealed for 90 minutes at 500° C. The sheet resistance of the resultant NiSi layers is shown in FIG. 8 as a functions implantation dosage. Apparently, a sizable increase of sheet resistance is observed for N implantation at $1.0 \times 10^{15}$ cm$^{-2}$ dosage. (i.e., a dosage required for sufficient leakage suppression). This undesired increase may be ascribed to N atoms acting as scattered impurities, thus increasing the electrical resistivity of the N-containing NiSi layer. By contrast, F implantation at $1.0 \times 10^{14}$ cm$^{-2}$ (i.e., an enough dosage for sufficient leakage suppression) minimizes the sheet resistance. Furthermore, even with a higher dosage of $1.0 \times 10^{15}$ cm$^{-2}$, only a marginal increase of the sheet resistance was observed.

Clearly, the only pre-silicide implantation applicable to a complementary MOSFET circuit (C-MOS circuit) and capable of effective leakage suppression without undesired side-effects such as introduction of scattering impurities or the rise in electrical resistivity is F implantation.

Figure 9:
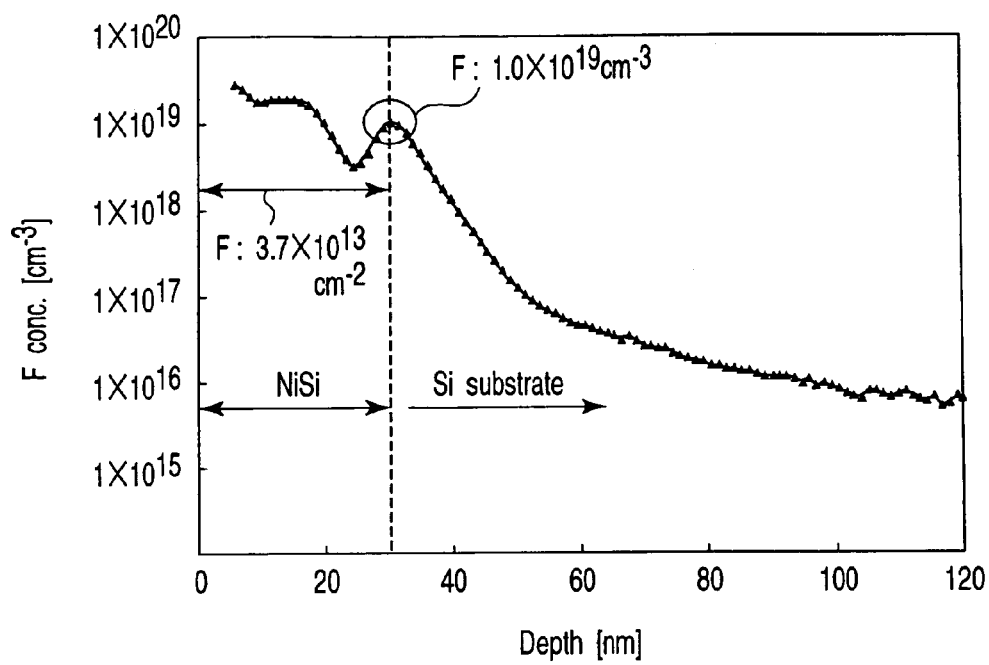
FIG. 9 is a depth distribution of F inside and around NiSi layer formed on a F-implanted Si substrate.

In order to probe the origin of the superior F effects for thermal stabilization of NiSi and efficient blockage of Ni infiltration into the Si substrate, a depth profile of implanted F atoms in and around the NiSi layer was measured. After pre-silicide F implantation at a dosage of $1.0 \times 10^{14}$ cm$^{-2}$ and subsequent 30 nm-thick NiSi layer formation, distribution of F inside the NiSi layer and in the vicinity of the NiSi/Si interface was investigated by SIMS analysis, the results being shown in FIG. 9. The areal density of F incorporated inside the NiSi film was $3.7 \times 10^{13}$ cm$^{-2}$. Further, the peak concentration of the F distribution was found at the interface of NiSi/Si, the concentration of the peak being $1.0 \times 10^{19}$ cm$^{-3}$. It has been confirmed that incorporation and accumulation the F atoms having the aforementioned areal density and peak concentration improves the thermal stability of the NiSi film and prevents Ni atoms from migrating into the Si substrate.

As explained above in great detail, F atoms implanted into the Si substrate at a dosage of $8.0 \times 10^{13}$ cm$^{-2}$ or more prior to the silicidation are mainly incorporated inside the NiSi film during the silicidation and thereby significantly improve the thermal stability of the film. Thanks to the improved thermal stability, it is now possible to anneal contacts between NiSi layers on the fine source/drain regions and wiring metallic substance formed over them at a temperature as high as 500° C. or more to easily secure an excellent electric contact.

Pre-silicide F implantation enables thermally stable silicide layer formation on very shallow junctions without leakage generation and any other adverse side-effects. As a result, a high performance MOSFET which is free from short channel effects and capable of high speed operation with a high driving power is easily realized.

EMBODIMENT 1

This embodiment will be explained with reference to FIGS. 10 to 17.

Figure 10:
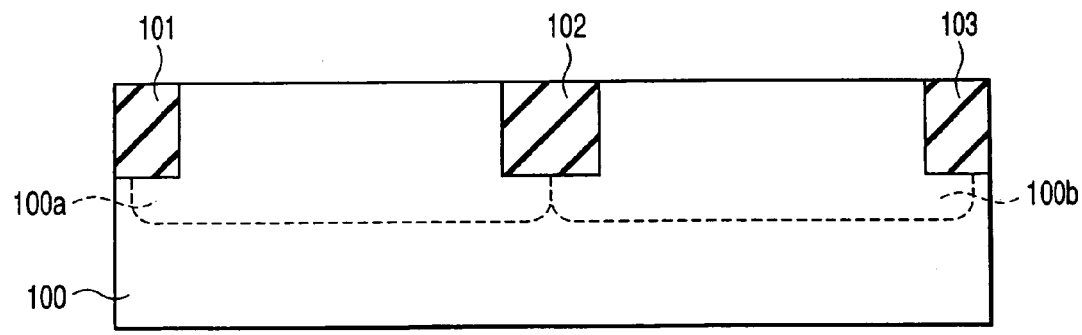
FIG. 10 is a cross-sectional view illustrating one of the steps in the manufacturing method of a semiconductor device according to Embodiment 1.

First of all, as shown in FIG. 10, shallow trenches are formed according to the ordinary procedures in a p-type silicon semiconductor substrate 100. Then, these shallow trenches are filled with an insulating material such as a silicon oxide film to form device isolation regions 101, 102 and 103. This semiconductor substrate 100 also comprises a p-type well region 100a and an n-type well region 100b both formed according to the ordinary procedures including ion implantation, heat treatment, etc.

Figure 11:
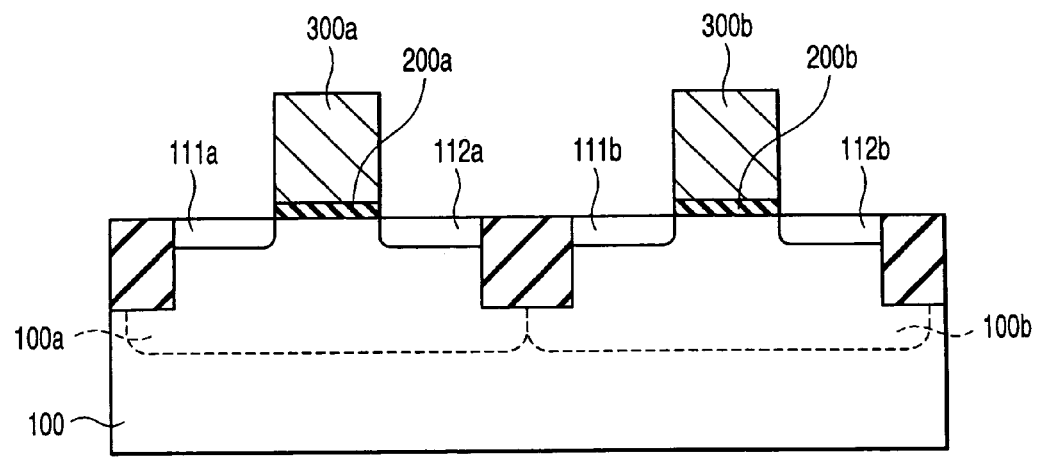
FIG. 11 is a cross-sectional view illustrating one step to be performed subsequent to the step shown in FIG. 10.

Then, as shown in FIG. 11, gate electrodes 300a and 300b are formed according to the ordinary procedures on the semiconductor substrate 100 with gate insulating films 200a and 200b being interposed therebetween. These gate insulating films may be constituted by a thermal oxide film having a thickness of 5 nm for instance. The gate electrodes may be formed by depositing, for example, a polysilicon layer to a thickness of 200 nm. With these gate insulating films and gate electrodes being employed as a mask, impurities are ion-implanted into well region to form shallow diffusion layers 111a, 112a, 111b and 112b.

Figure 12:
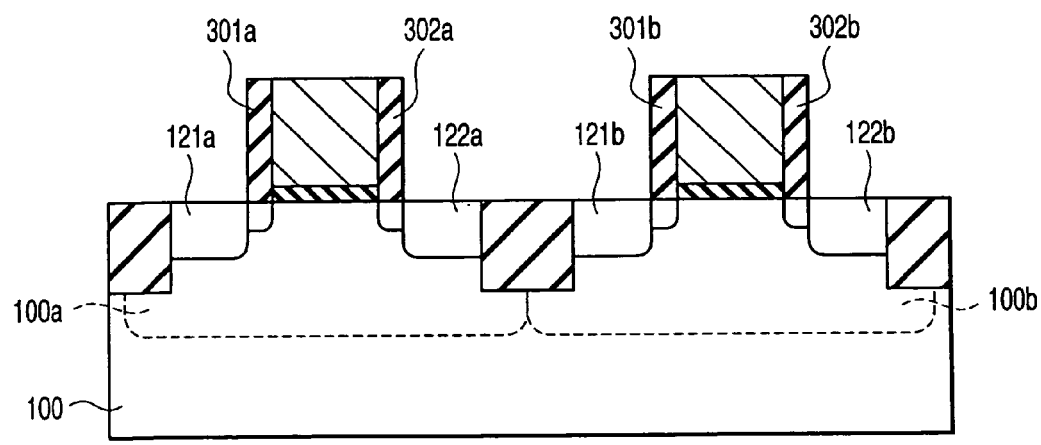
FIG. 12 is a cross-sectional view illustrating one step to be performed subsequent to the step shown in FIG. 11.

Thereafter, as shown in FIG. 12, gate sidewalls 301a, 302a, 301b and 302b are formed according to the ordinary procedures. As for the gate sidewalls, it is possible to employ a silicon nitride film having a thickness of 20 nm. With these gate sidewalls being employed together with the gate electrodes as a mask, impurities are ion-implanted into the substrate to form diffusion layers 121a, 122a, 121b and 122b. On this occasion, the electrodes 300a and 300b are concurrently ion-implanted with impurities of the same conductivities as the respective diffusion layers. Subsequently, the resultant substrate is subjected to a rapid thermal annealing (RTA) to activate the impurities thus injected. The diffusion layers 121a, 122a, 121b and 122b are formed down to a depth of 100 nm for instance as measured from the surface of the silicon semiconductor substrate 100.

Figure 13:
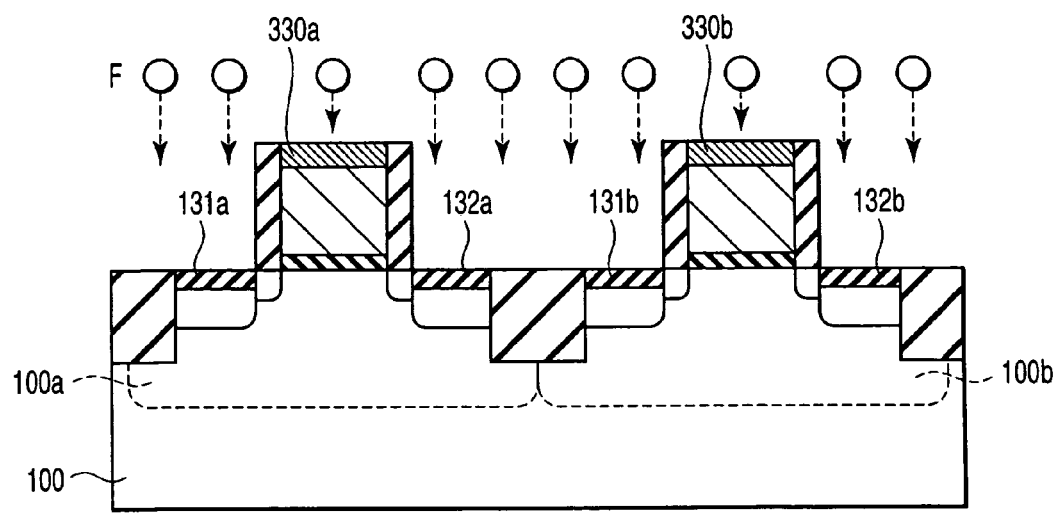
FIG. 13 is a cross-sectional view illustrating one step to be performed subsequent to the step shown in FIG. 12.
Figure 14:
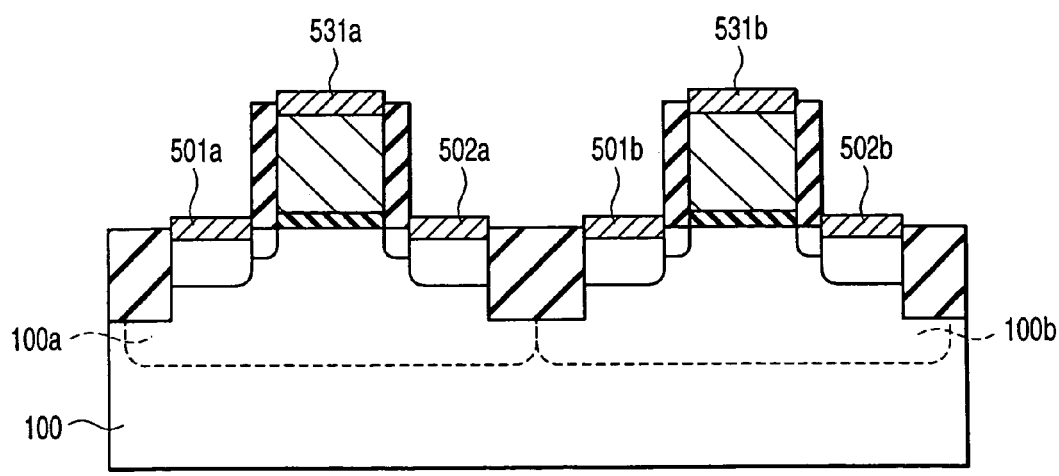
FIG. 14 is a cross-sectional view illustrating one step to be performed subsequent to the step shown in FIG. 13.

Subsequently, as shown in FIG. 13, F atoms are implanted into the silicon semiconductor substrate 100 with an energy of 2 keV and at a dosage of $1.0 \times 10^{14}$ cm$^{-2}$. With this implantation energy, the implantation range of the F atoms into the Si substrate is confined within a depth of 10 nm or less. As a result, F-containing regions 131a, 132a, 131b and 132b each having a thickness of about 10 nm are formed on the diffusion layers 121a, 122a, 121b and 122b, respectively. In the same manner, F-containing regions 130a and 130b each having a thickness of about 10 nm are formed on the gate electrodes 300a and 300b, respectively. The depth to which the F ions can be injected should preferably be confined within the range of the film thickness of Si that will be consumed in a subsequent silicide-forming reaction. For example, if it is desired to form an NiSi layer having a thickness of 30 nm, the thickness of Si to be subsequently consumed is 24 nm. Therefore, the F-containing region included within this range would be completely consumed in a subsequent silicide-forming reaction.

Further, a Ni film is sputtered over the entire surface and then subjected to a rapid heat treatment to permit the silicide-forming reaction to selectively proceed between the Ni and part of the silicon which is directly contacted with the Ni. This Ni film can be deposited to a thickness of 12 nm for instance according to the ordinary procedures. If required, a cap layer such as Ti or TiN may be formed over this Ni film.

Then, the resultant substrate is dipped in a solution consisting of mixture of sulfuric acid and hydrogen peroxide to selectively remove the unreacted Ni, thereby forming NiSi regions 501a, 502a, 501b and 502b on the diffusion layers, and also forming NiSi regions 531a and 531b on the gate electrodes. In all of these NiSi regions, the film thickness thereof is in the range of 28 nm to 30 nm.

Concomitant with the silicide-forming reaction, part of F in the F-containing regions 131a, 132a, 131b and 132b is incorporated in the NiSi film and accumulated in the NiSi/Si interface. In this case, the areal density of F in the NiSi film is $3.7 \times 10^{13}$ cm$^{-2}$, and the maximum concentration of F in the NiSi/Si interface is $1.0 \times 10^{19}$ cm$^{-3}$.

Owing to this F, the thermal stability of the NiSi layer is improved, so that there is no possibility of generating leakage current as long as the heat treatment is performed within the constraints as defined by the aforementioned formula (A). In the present case, the junction depth from the bottom of the silicide is about 70 nm, so that a heat treatment for 148 minutes at 500° C. or a heat treatment for 80 minutes at 550° C. is allowable.

Figure 15:
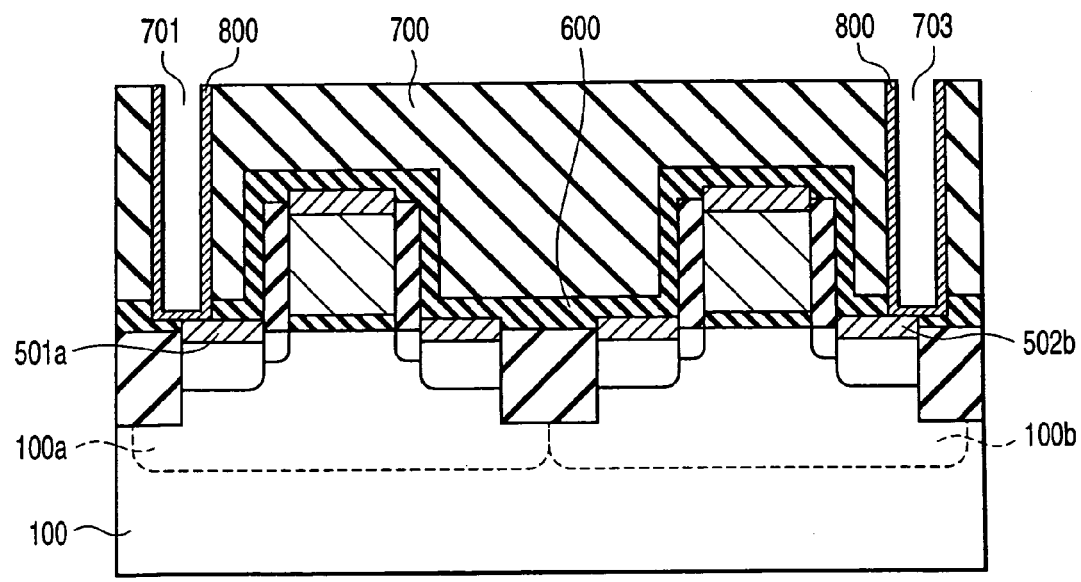
FIG. 15 is a cross-sectional view illustrating one step to be performed subsequent to the step shown in FIG. 14.

Thereafter, a silicon nitride layer 600 and a silicon oxide film 700 are successively deposited over the entire surface as insulating interlayers as shown in FIG. 15. Further, contact holes 701 and 703 are etched through the interlayers and the interiors of them are covered with a metallic substance 800 as a barrier layer.

The silicon nitride layer 600 serves as a liner layer which acts as a barrier layer during the deposition of the interlayer 700 and also acts as an etching stopper layer during the contact hole etching through the interlayer 700. Accordingly, the silicon nitride layer 600 is required to be deposited uniformly, conformally and densely to a thickness of, for example, 20 nm over the entire surface of the substrate. Generally, the substrate of the LSI circuit is full of fine structures with rough topography such as protrusions of gate electrodes. The required uniform and conformal deposition of the silicon nitride film over the rough topography at a low temperature is attainable with a chemical vapor deposition (CVD) method using such as $Si_2Cl_6$ and $NH_3$ as feed gases. Another method capable of uniform and conformal deposition at a low temperature is atomic layer deposition (ALD) method using such as $SiH_2Cl_4$ and $NH_3$ as feed gases.

Figure 16:
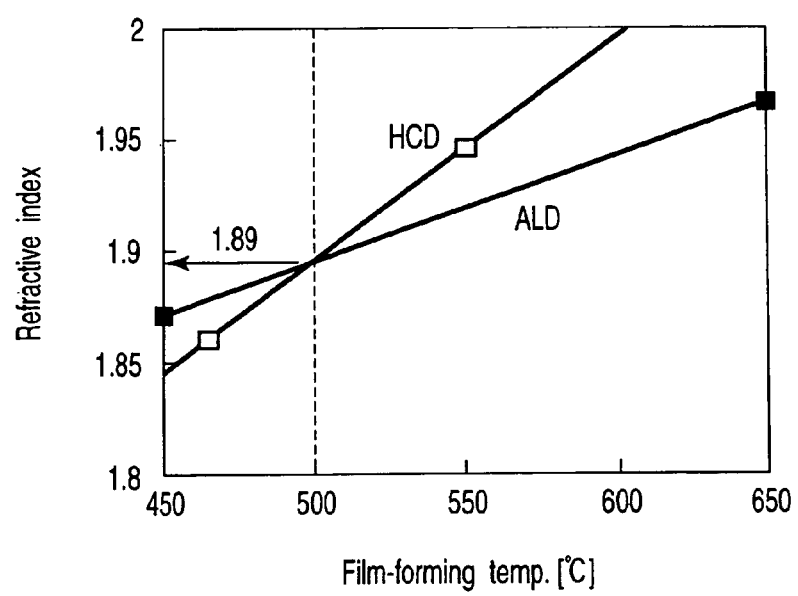
FIG. 16 is a graph illustrating the relationship between the film-forming temperature of silicon nitride film and the refractive index for two different deposition methods.

Regarding to this low temperature deposition, it has been found by the present inventor that the refractive index of the silicon nitride film (which is a good indicator of the film density) is closely correlated with the deposition temperature. Actually, FIG. 16 shows the refractive indexes of the silicon nitride films obtained by aforementioned two kinds of methods as functions of the deposition temperature. When the silicon nitride film is formed at a low temperature below 500° C., irrespective of deposition methods, its refractive index becomes smaller than 1.89.

Here it should be noted that, with the decrease of formation temperature of the silicon nitride film, however, its deposition rate is reduced precipitously. Thus, in order to secure not only uniform but also productive deposition of the silicon nitride film, the silicon nitride film is better to be formed at a temperature not lower than 500° C.

In the present embodiment, thanks to the pre-silicide F implantation at a pre-determined dosage, the improved thermal stability of the NiSi layer allows annealing even at a temperature of 500° C. or more. Therefore, the silicon nitride film can be formed at a temperature of 500° C. or more, thereby making it possible to obtain a liner layer which is sufficiently dense, uniform and conformal over fine LSI structures without compromising the productivity of the manufacturing. Naturally, the liner layer 600 thus formed at a temperature of 500° C. or more has a refractive index of 1.89 or more.

It should be also noted that, instead of CVD or ALD method, when a plasma assisted chemical vapor deposition (PACVD) method is employed in the formation of a silicon nitride film, its density, uniformity and conformality over the fine structures would be extremely deteriorated. In this respect, the methods described previously are much more preferable for the purpose of securing the liner function. Of course, with PECVD method, the refractive index of the resultant silicon nitride film becomes lower than the aforementioned value.

In the present embodiment, since the silicon nitride layer 600 which was formed stably, densely and uniformly at a temperature of 500° C. or more, the contact holes were not necessarily required to be formed in exact alignment with the NiSi region (i.e., so called "borderless contact" is allowed). Therefore, the manufacturing process is simplified, and thus, the manufacturing cost is reduced. In order to enjoy the most of these advantages provided by a liner layer, it is very important to form the liner layer sufficiently densely and uniformly.

The silicon oxide film 700 to be formed as an interlayer insulating film can be deposited by feeding $O_3$ and $Si(OC_2H_5)_4$ (tetraethoxy silane: TEOS) gas at a temperature of 400° C. for instance. Alternatively, a spin coating of a material such as SOG (Spin on Glass, silicon compound; $R_nSi(OH)_{4-n}$; wherein R is an organic molecule; and an additive) may be employed. In this case, this coating material is spin-coated by a spinner, and then, the coated layer is heat-treated for 30 minutes in a nitrogen gas atmosphere and at a temperature of 300° C. During the heat treatment, the components other than silicon oxide evaporate to finally obtain the silicon oxide film 700.

The contact holes 701 and 703 can be formed according to the ordinary technique such as a lithography method and an RIE method so as to enable these holes to reach the NiSi region 501a over the source and to reach NiSi region 502b over the drain, respectively. The RIE should preferably be performed in two stages. Namely, first of all, by using the liner layer (silicon nitride film) 600 as an etching stopper for RIE, a selective etching of the oxide film against the silicon nitride film is performed. Thereafter, the thin liner layer (silicon nitride film) 600 left on the bottom of the contact hole is removed by a short-time etching without concerns for over-etching. Since the etching can be accomplished within a short period of time, the plasma damage to the underlying NiSi region can be also avoided. It should be also mentioned here that, the etching-stop function of the liner layer provides yet another important advantage (i.e., allowance of borderless contact or lax alignment). Even when a portion of the bottom of the contact hole comes to overlap with the device isolation region (which is filled up with silicon oxide) due to some lax alignment, the liner layer prevents the first contact hole RIE (i.e., silicon oxide etching) from etching unstoppably down to the bottom of the shallow trench and impairing the isolation function. Liberation from a severe requirement for exact alignment of the contact hole formation allows high yield production and thus provides significant cost advantage for LSI manufacturing.

Prior to the deposition of the metallic substance 800, short time exposure of the contact hole bottoms to $NF_3$-containing plasma may clean the surfaces of NiSi regions contaminated with the RIE process. The layer of the metallic substance 800 can be formed thereafter by the deposition of Ti for instance to a thickness of 5 nm, thus obtaining the structure shown in FIG. 15.

Subsequently, in order to secure an excellent electrical contact between the metallic substance 800 and the NiSi regions 501a and 502b, the resultant substrate is subjected to a heat treatment in a nitrogen gas atmosphere under the conditions defined by the aforementioned formula (A). For example, when the deposition of the liner layer 600 took 58 minutes at a temperature of 500° C., it is still possible to anneal the contacts for 90 minutes at a temperature of 500° C. After the annealing, a thin oxide layer, which tends to be formed on an upper portions of the once-exposed NiSi regions 501a and 502b can be removed by Ti, resulting in an excellent electrical contact between these NiSi regions and metallic substance 800. As already explained above, thanks to the pre-silicide F implantation, leakage generation is completely suppressed even if the NiSi layer is thus subjected to a heat treatment for 90 minutes at a temperature of 500° C.

After finishing this heat treatment, the contact holes 701 and 703 are filled by CVD, for example, with W 900 using $W(CO)_6$ and $H_2$ as feed gases. The previous annealing also turned the surface of the metallic substance 800 into a sufficiently dense structure so that it protects the underlying NiSi during the CVD process.

Subsequently, a silicon oxide film 1000 is deposited as an interlayer insulating film and then wiring trenches 1001 and 1002 are formed according to the ordinary procedures. These trenches are filled with a metallic substance for example a Cu film 1100 (damascene method). Subsequently, an insulating material, for example, a silicon oxide film 1200 is deposited so as to cover an upper portion of the wiring substance, thereby obtaining a structure as shown in FIG. 17. If required, a multi-layer wiring can be formed and then, the resultant structure is subjected to a packaging process to accomplish the LSI circuit.

In this embodiment, the pre-silicide F implantation improves the thermal stability of the NiSi layer. As a result, the generation of junction leakage can be suppressed even at the shallow source/drain diffusion layer. The implanted F is not only electrically inactive in silicon but also highly effective in suppressing the leakage current even with a dosage as low as $1.0 \times 10^{14}$ cm$^{-2}$. Accordingly, compensation of $n^+$ and $p^+$ source/drain polarity can be avoided, thus making this embodiment readily applicable to the manufacture of CMOS circuit.

Further, the improved thermal stability of the NiSi allows a heat treatment of otherwise thermally instable NiSi layer under the conditions defined by the aforementioned formula (A). The tolerance for the heat treatment enables not only formation of a liner layer which is sufficiently dense and uniform but also securing an excellent electrical contact between the NiSi layer and the wiring metal. The MOSFET thus manufactured according to this embodiment is excellent in reliability and high in drivability.

EMBODIMENT 2

This embodiment will be explained with reference to FIGS. 18 to 23.

First of all, following same process as explained in the Embodiment 1, the structure as shown in FIG. 12 is formed except that the depth of the diffusion layers 121a, 122a, 121b and 122b is set to be 80 nm in this embodiment.

Subsequently, as shown in FIG. 18, a silicon film 400 is deposited to a thickness of 20 nm over the entire surface according to the ordinary procedures. Preferably, the silicon film 400 is deposited by a CVD method, since a film having uniform thickness and quality can be obtained with this method. Otherwise, non-uniformity in film thickness and quality cannot be avoided by an epitaxial growth technique. Because silicidation comes to encroach deep into the source/drain junction at a locally thin or weak spot of the silicon film, non-uniformity in film thickness and quality must be avoided. Moreover silicon layers formed over the device isolation regions by the CVD method can be used as extensions of the source/drain regions. They reduce the coupling capacity with the substrate and enable a high-speed operation of the MOSFET.

In fact, the portions 401 and 403 extended over the device isolation regions are to be utilized as elevated source/drain and the portion 402 is to be utilized as a local interconnection between adjacent MOSFET. Except the above-mentioned portions, the silicon film 400 is removed according to the ordinary procedures.

Then, the remaining portions of the silicon film are exposed to a carbon-containing plasma according to the ordinary procedures. As for the carbon source, it is possible to employ any supply source which is capable of feeding carbon to the plasma. For example, the carbon-containing plasma may be generated by feeding gas such as $CF_4$, $CHF_3$, $CCl$, $CH_4$, etc. into the plasma. In the case where a carbon-containing substance such as a photoresist mask is existed on the substrate, it is possible to utilize carbon atoms liberated from the photoresist by ion impingement associated with the plasma.

Generally, in order to maintain the state of plasma, the plasma comes to have a positive electric 25 potential against the surrounding materials. As a result, vertical electric fields develop over the main surfaces of the surrounding materials in the direction which enables positively charged particles to impinge vertically into the main surfaces of the surrounding materials. Therefore, the positively charged carbon particles in the plasma impinge vertically against the gate electrodes 300a and 300b as well as against the silicon film 400. In this case, only surfaces horizontal to the substrate are injected with carbon atoms while surfaces vertical to the substrate are not injected with carbon atoms. As a result, carbon-containing silicon layers are formed only on the horizontal surfaces. Since the particle injected from the ordinary RIE plasma is accelerated at 1 kV or less, the thickness of thus created carbon-containing silicon layer would be limited to several nanometers. The amount of carbon in this carbon-containing silicon layer should preferably be at least 1 atomic %.

Figure 19:
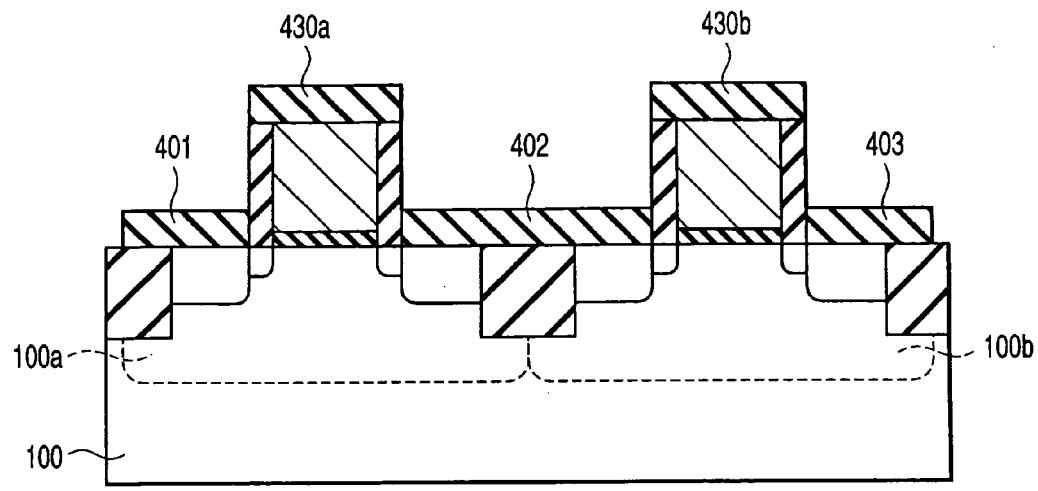
FIG. 19 is a cross-sectional view illustrating one step to be performed subsequent to the step shown in FIG. 18.

When this carbon-containing silicon layer is thermally oxidized, an oxide film which cannot be etched away in an HF solution can be formed. This principle is disclosed by the present inventor in U.S. Pat. No. 6,271,566 B1. On the other hand, since ordinary oxide film is formed on the vertical wall portions of the silicon film 400, it is possible to selectively leave the oxide films only on the horizontal surfaces of the silicon film 400 by dipping the substrate in an HF solution after the thermal oxidation. By using these oxide films as masks, an isotropic silicon etching selective to the oxide films is performed. For example, an etching such as chemical dry etching (CDE) is performed so as to remove only the vertical portions of the silicon film 400. Thereafter, the oxide films remaining on the horizontal surfaces of the silicon film 400 are removed by the RIE method for instance. As a result, as shown in FIG. 19, there will be formed additional source/drain silicon layers 401 and 403 partially extending over the device isolation regions, the silicon layer 402 for a local interconnection, and additional silicon layers 430a and 430b on the gate electrodes. It should be noted here that, when the silicidation is performed over the upper surface of this additionally-formed silicon layer, the junction depth from the reaction surface would become 20 nm+80 nm=100 nm even though initially formed source/drain junctions are only 80 nm deep.

Figure 20:
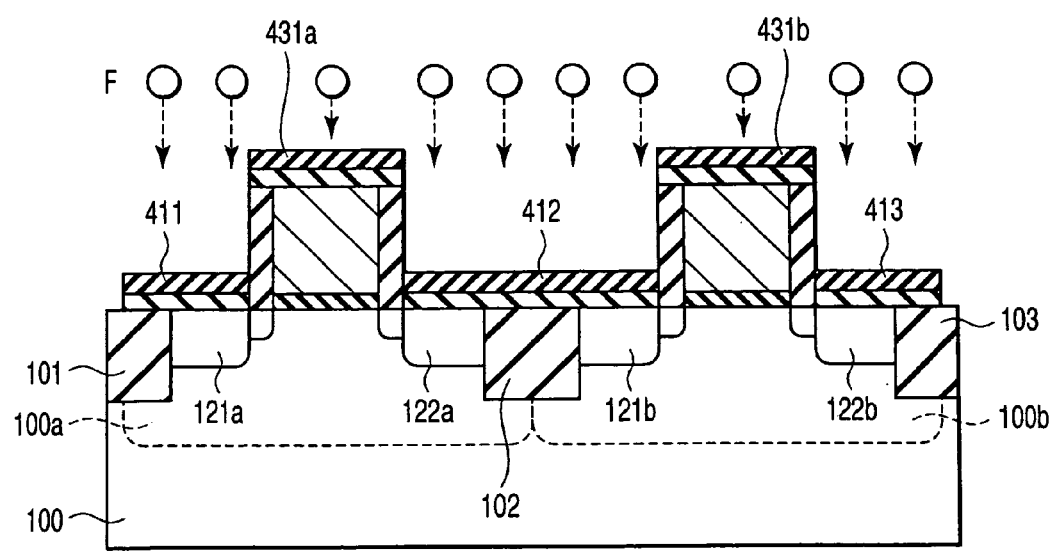
FIG. 20 is a cross-sectional view illustrating one step to be performed subsequent to the step shown in FIG. 19.
Figure 21:
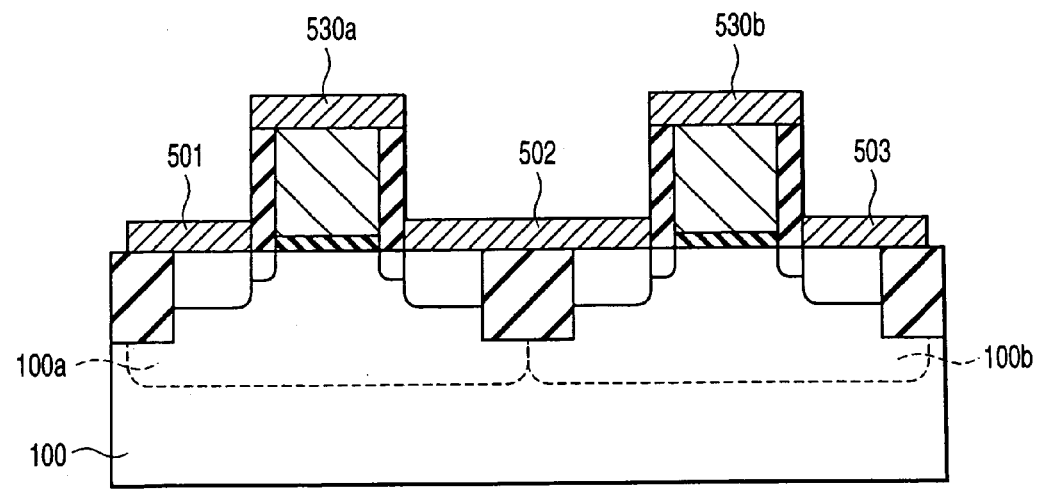
FIG. 21 is a cross-sectional view illustrating one step to be performed subsequent to the step shown in FIG. 20.

Thereafter, as shown in FIG. 20, F atoms are implanted with energy of 2 keV and at a dosage of $8.0 \times 10^{13}$ $cm^{-2}$. With this implantation energy, the implantation range of the F atoms into the additional Si layer would be limited to 10 nm or less. As a result, F-containing regions 411 and 413 are formed on the additional source/drain-silicon layers 401 and 403. F-containing region 412 is also formed on the silicon layer 402. Further, F-containing regions 431a and 431b are formed on and additional silicon layers 430a and 430b. All of these F-containing regions are as thin as 10 nm or so and hence can be completely consumed in a subsequent silicide-forming reaction.

The extension of the additional source/drain-silicon layers 401 and 403 over the device isolation region and the presence of the silicon layer 402 between the devices protect the periphery between the diffusion layers 121a, 122a, 121b and 122b and the device isolation regions 101, 102 and 103 from F injection. This is noticeable because a high concentration of F injected into these boundary portions could erode the oxide films filling up the device isolation regions, leading to possible etching-off of the oxide films in a subsequent HF treatment. In particular, this HF treatment is prerequisite to silicidation as a pre-treatment. Thus, sideway silicidation at eroded or grooved portions of the isolation films surrounding the diffusion layers may cause unexpectedly deep encroachment of the resultant silicide layers into the source/drain junctions. In effect, the intended junction depth is reduced at its perimeter by the undesired erosion or grooving of the isolation films surrounding the diffusion layers. The unwitting reduction of the junction depth induces unwelcome junction leakage. Thus, the protection provided by the additional source/drain-silicon layers 401 and 403 as well as the silicon layer 402 amounts to a great benefit for stable LSI manufacturing. Moreover, it should be emphasized that, in this embodiment, not only the unwitting reduction of the junction depth is prevented but also an effective junction depth is actually increased by the thickness of the additional silicon layers.

After formation of the F-containing regions, a Ni film is deposited over the entire surface and is subjected to a rapid heat treatment in a nitrogen gas atmosphere at a temperature of 450° C. for 30 seconds, thereby making the Ni to selectively react with the silicon which is in direct contact with the Ni to form the silicide. This Ni film can be deposited to a thickness of 12 nm for instance by the ordinary procedures. If required, a cap layer of metallic substance such as Ti and TiN may be formed on this Ni film.

Then, the resultant substrate is dipped in a solution consisting of mixture of sulfuric acid and hydrogen peroxide to selectively remove the unreacted Ni, thereby forming NiSi regions 501 and 503 on the additional source/drain-silicon layers 401 and 403, respectively, and also forming NiSi region 502 on the silicon layer 402 where a local interconnection is to be formed. Furthermore, NiSi regions 530a and 530b are formed respectively on the additional silicon layers 430a and 430b located over the gate electrodes. In all of these NiSi regions, the film thickness thereof is in the range of 28 nm to 30 nm. The silicidation will comsume practically all these additional silicon layers.

Concomitant with the silicide-forming reaction (silicidation), part of F in the F-containing regions 411, 413, 412, 431*a* and 431*b* is incorporated in the NiSi film and accumulated in the NiSi/Si interface. In this case, the areal density of F in the NiSi film is $3.0\times10^{13}$ cm$^{-2}$, and the maximum concentration of F in the NiSi/Si interface is $8.0\times10^{18}$ cm$^{-3}$.

Owing to this F, the thermal stability of the NiSi layer is improved, so that there is no possibility of generating leakage current as long as the heat treatment is performed within the constraints as defined by the aforementioned formula (A). In the present case, the junction depth from the bottom of the silicide is about 70 nm, so that a heat treatment for 148 minutes at 500° C. or a heat treatment for 80 minutes at 550° C. is allowable.

A distinguishing feature of the NiSi regions 530*a* and 530*b* formed over the gate electrodes is that they only contain F without incorporation of dopant impurities irrespective of the polarity of the MOSFET. It is known that resistivity of a NiSi layer formed by silicidation of a silicon layer containing both p-type and n-type impurities increases compared to a NiSi layer formed over a silicon layer containing only one type of impurity.

In the conventional CMOS fabrication, a portion of the gate polysilicon electrodes connecting an n-MOSFET and a p-MOSFET is implanted with both types of impurities. The increased resistivity of a NiSi formed on this portion comes to retard signal propagation through this gate line. According to this embodiment, however, the silicon layers 430*a* and 430*b* containing only. F is formed on an upper portion of the gate polysilicon electrodes, and a silicide is formed on these silicon layers 430*a* and 430*b*. Therefore, otherwise inevitable increase of resistivity of NiSi layer is avoided. As a result, the electric resistance of narrow gate polysilicon electrodes coupling an n-MOSFET and a p-MOSFET can be effectively minimized. Moreover, besides formation of low resistance NiSi on gate electrodes, the silicidation in this embodiment also realizes the local interconnection at the same time, greatly simplifying the manufacturing process.

Figure 22:
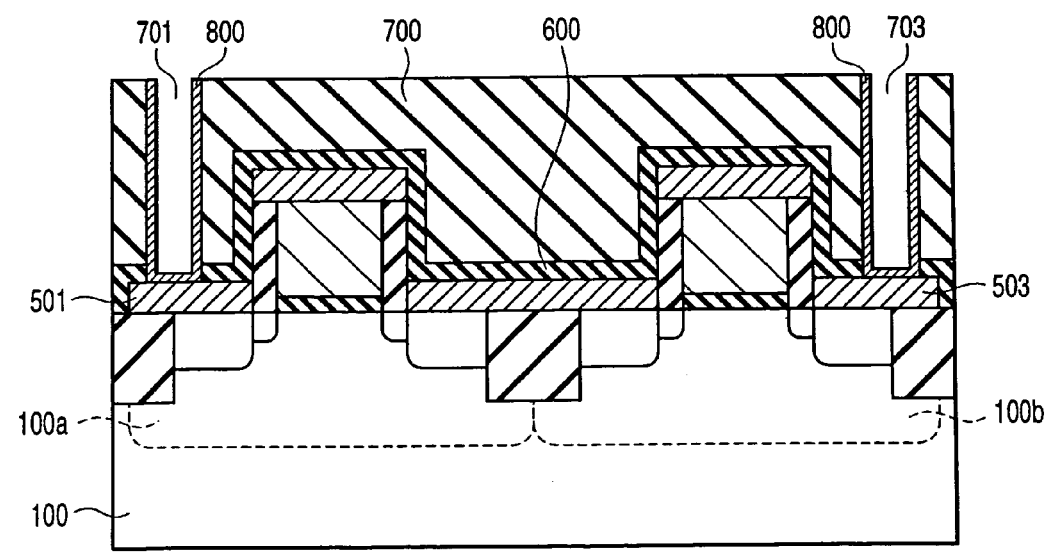
FIG. 22 is a cross-sectional view illustrating one step to be performed subsequent to the step shown in FIG. 21.

Thereafter, a silicon nitride layer 600 and a silicon oxide film 700 are successively deposited over the entire surface as insulating interlayers as shown in FIG. 22. Further, contact holes 701 and 703 are etched through the interlayers and the interiors of them are covered with a metallic substance 800 as a barrier layer. The deposition of these layers and the formation of contact holes can be performed in the same manner as in the case of Embodiment 1 mentioned above.

In the present embodiment, thanks to the pre-silicide F implantation at a pre-determined dosage, the improved thermal stability of the NiSi layer allows annealing even at a temperature of 500° C. or more. Therefore, the silicon nitride film can be formed at a temperature of 500° C. or more, thereby making it possible to obtain a liner layer which is sufficiently dense, uniform and conformal over fine LSI structures without compromising the productivity of the manufacturing. Of course, the liner layer thus formed at a temperature of 500° C. or more has a refractive index of 1.89 or more and almost the same effects as in the case of Embodiment 1. For example, the contact holes were not necessarily required to be formed in exact alignment with the NiSi region (i.e., so called "borderless contact" is allowed). Even when a portion of the bottom of the contact hole comes to overlap with the device isolation region (which is filled up with silicon oxide) due to some lax alignment, the liner layer prevents the first contact hole RIE (i.e., silicon oxide etching) from etching unstoppably down to the bottom of the shallow trench and impairing the isolation function.

Also, thanks to the pre-silicide F implantation, an excellent electrical contact between the metallic substance 800 and the NiSi regions 501*a* and 502*b* can be obtained by annealing in a nitrogen gas atmosphere within the constraints defined by the aforementioned formula (A). For example, when the deposition of the liner layer 600 took 58 minutes at a temperature of 500° C., it is still possible to anneal the contacts for 90 minutes at a temperature of 500° C. After the annealing, a thin oxide layer, which tends to be formed on an upper portions of the once-exposed NiSi regions can be removed by Ti, resulting in an excellent electrical contact between these NiSi regions and metallic substance 800. As already explained above, leakage generation is completely suppressed even if the NiSi layer is thus subjected to a heat treatment for 90 minutes at a temperature of 500° C.

After finishing this heat treatment, the contact holes 701 and 703 are filled by CVD, for example, with W 900 in the same manner as described in Embodiment 1.

Figure 23:
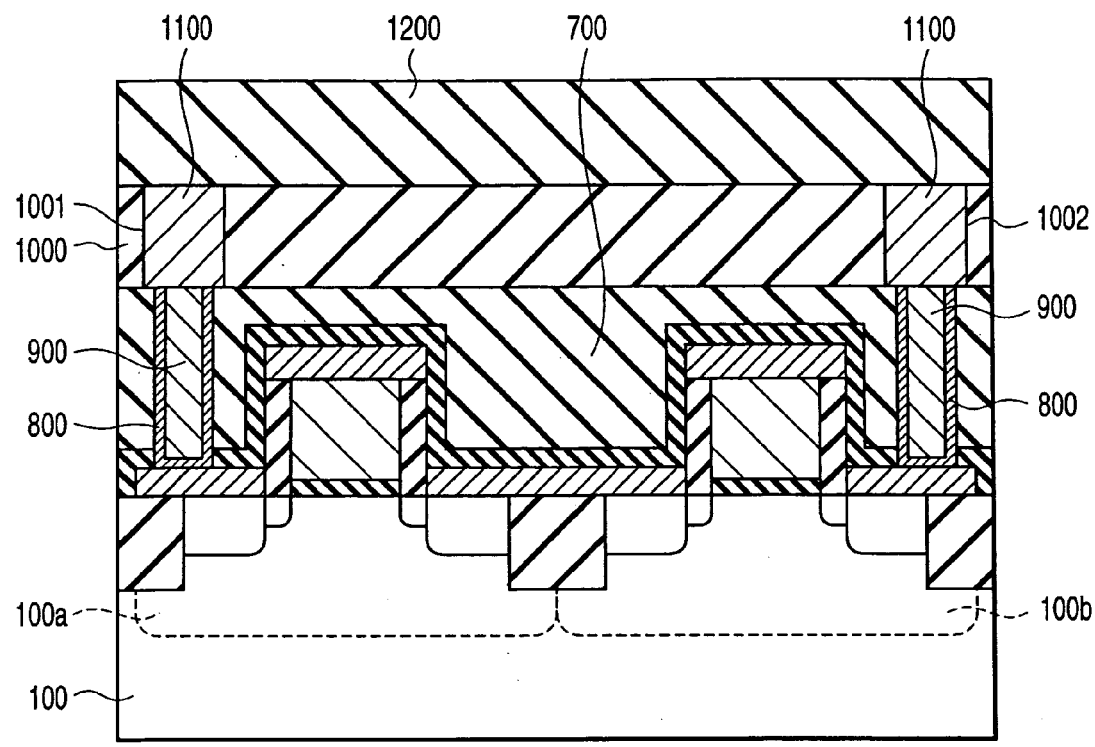
FIG. 23 is a cross-sectional view illustrating one step to be performed subsequent to the step shown in FIG. 22.

Thereafter, a silicon oxide film 1000 is deposited as an interlayer insulating film and then wiring trenches 1001 and 1002 are formed according to the ordinary procedures. These trenches are filled with a metallic substance for example a Cu film 1100. Subsequently, an insulating material, for example, a silicon oxide film 1200 is deposited so as to cover an upper portion of the wiring substance, thereby obtaining a structure as shown in FIG. 23. If required, a multi-layer wiring is formed and then, the resultant structure is subjected to a packaging process to accomplish the LSI circuit.

In this embodiment, since a portion of the source/drain electrodes extends over the isolation region, the coupling capacity thereof with the substrate can be minimized, thus enabling a high-speed operation of the semiconductor devices.

Since the NiSi layers formed over the gate electrodes contain only F irrespective of the polarity of the MOSFET, the resistivity of the NiSi layer formed on the upper portion of the gate polysilicon electrodes coupling the n-MOSFET with the p-MOSFET would not be increased.

Further, the extension of the additional source/drain-silicon layers over the device isolation region and the presence of the silicon layer between the devices protect the periphery between the diffusion layers and the device isolation regions from F injection. As a result, undesired erosion or grooving of the isolation films surrounding the diffusion layers, therefore unwitting reduction of the junction depth, is well prevented. Moreover, an effective junction depth is actually increased by the thickness of the additional silicon layers.

Yet, since the formation of local interconnection can be accomplished concurrently with the silicide-forming reaction, the process of manufacturing can be simplified.

Furthermore, the additional silicon layers having uniform thickness and quality obtained by the CVD method (which is otherwise unattainable by an epitaxial growth technique) enable stable silicide formation on them without deep encroachment of the resultant silicide layers at a locally thin or weak spot of the silicon films.

Figure 24:
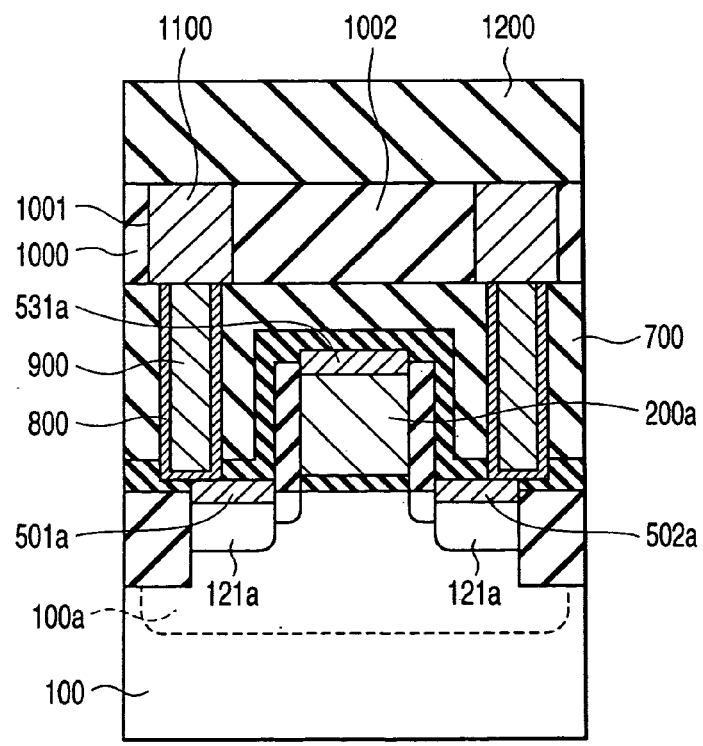
FIG. 24 is a cross-sectional view illustrating a semiconductor device according to one embodiment of the present invention.

The aforementioned technique is also applicable to a single n-type MOSFET as shown in FIG. 24, as well as to a group of a plurality of MOSFETs.

Figure 25:
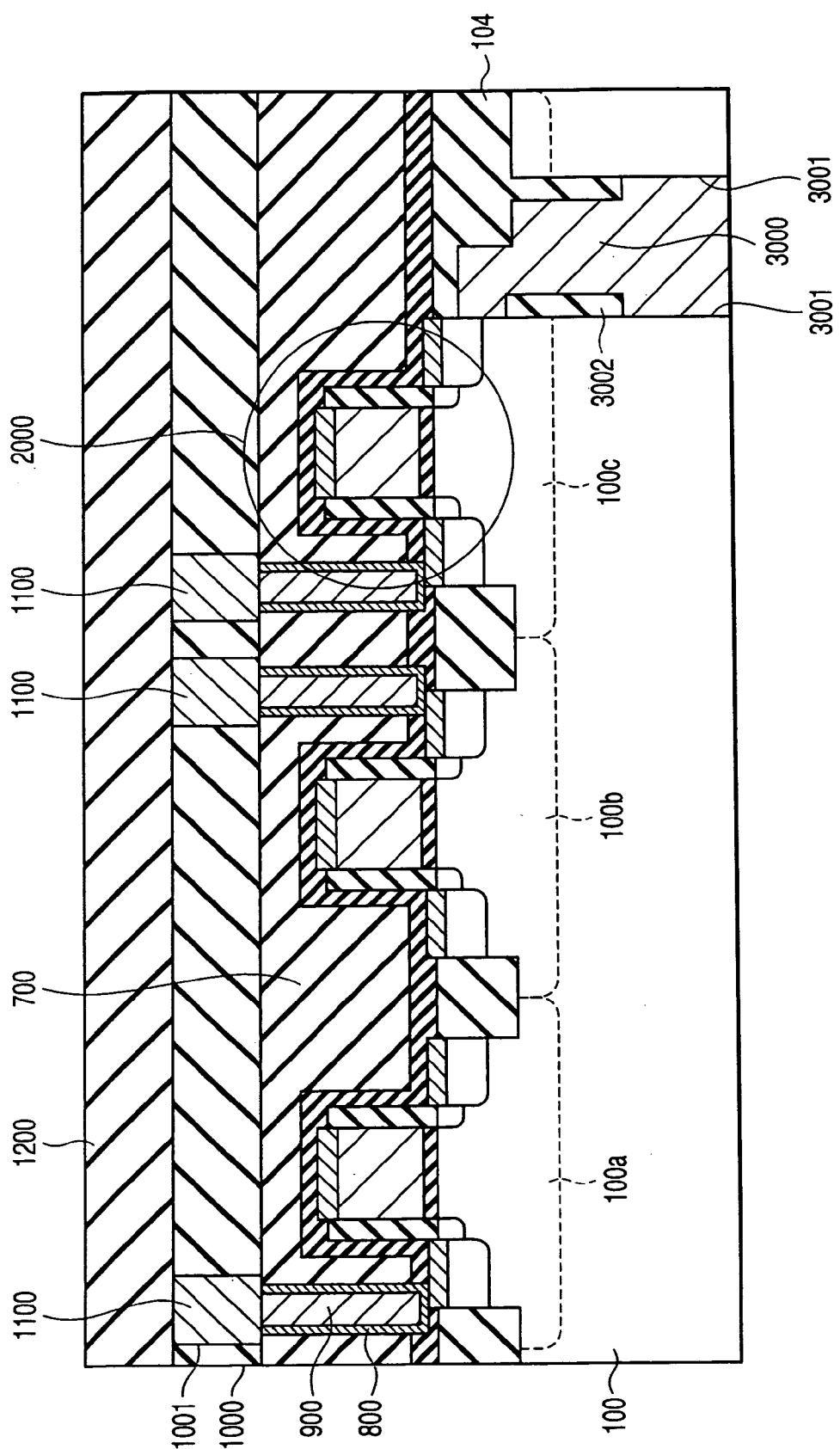
FIG. 25 is a cross-sectional view illustrating a semiconductor device according to another embodiment of the present invention.

Also, the aforementioned technique can be selectively applied to a group of MOSFETs constituting part of a semiconductor circuit, so that the aforementioned technique is applicable to semiconductor devices constituting a DRAM as shown in FIG. 25. In FIG. 25, an n-type MOSFET 2000 constituting a path-transistor of a trench-type DRAM is formed in the p-type well 100c of a p-type silicon substrate 100. Further, the p-type well 100c is provided therein with a storage node 3000 formed of polysilicon, a capacitor insulating film 3001 and a collar oxide film 3002; and an isolation region 104. Other components than the aforementioned additional components are the same as the structure shown in FIG. 23.

In any of these structures, migration of Ni atoms into the substrate can be suppressed in the same manner as the Embodiments 1 and 2 by the improved thermal stability of the NiSi layer. Thus, it is possible to form a silicide layer on the source, drain and gate electrodes in a self-aligned manner while keeping a shallow source/drain diffusion layer without junction leakage generation. The improved thermal stability also ensures an excellent electric contact thereof with the wiring metal.

The aforementioned technique of performing the ion implantation of F atoms prior to the formation of NiSi layer can be variously modified. For example, this technique can be applied in the same manner not only to the case where the upper portion of gate electrodes is desired to be partially turned into a silicide, but also to the case where the upper portions of gate electrodes is desired to be entirely turned into a silicide (Fully-Silicidated Gate). Further, this technique is applicable to an elevated source drain structure using an epitaxial selective growth method or to the silicidation of the MOSFET which is formed in an SOI (Silicon On Insulator) substrate, while securing the effects to be obtained by this technique.

Of course, the technique according to one embodiment of the present invention is effective to any kinds of metal silicide where the inclusion of F therein is effective in enhancing the thermal stability of the silicide.

According to one aspect of the present invention, it is possible to provide a semiconductor device wherein the electric resistance of the source, drain and gate electrodes can be minimized through the provision of a silicide layer containing NiSi while keeping a shallow source/drain junction, the semiconductor device being also minimal in junction leakage and capable of keeping an excellent electrical contact between the silicide layer and the wiring metal. According to another aspect of the present invention, there is also provided the manufacturing method of such a semiconductor device as mentioned above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, the device comprising MOSFET structure having an F-containing NiSi layer formed on diffusion regions and on gate electrodes, a depth from the bottom of the F-containing NiSi layer to the junction position of the diffusion regions being confined within the range of 20 to 100 nm, the method comprising:

forming the gate electrodes above a semiconductor substrate with a gate insulation film being interposed between the semiconductor substrate and the gate electrodes;

forming the diffusion regions by introducing an impurity into the semiconductor substrate with the gate insulating film and the gate electrodes being employed as a mask;

forming a F-containing layer on a surface layer of a silicide-forming region by ion-implanting F atoms at a dosage of $8.0 \times 10^{13}$ cm$^{-2}$ or more in the silicide-forming region of silicon for forming the silicide;

depositing a Ni film on the F-containing layer without heat-treating the F-containing layer;

heat-treating the Ni film to turn the silicon of the silicide-forming region into NiSi, thereby forming the F-containing NiSi layer on diffusion regions and on gate electrodes; and subjecting the F-containing NiSi layer to a heat treatment for a period of time equal to or shorter than, an allowable duration defined as a function of junction depth and temperature by the following formula (A):

$$t_a = Dj^2/\mathrm{Exp}(34.7 - 2.35 \times 10^4/Ta) + 68 \quad \text{(A)}$$

(wherein $t_a$ is the allowable duration (minutes); Dj is a depth (nm) of the position of junction as measured from the bottom of the NiSi layer; and Ta is a heat treatment temperature (K: Kelvin)).

2. The method according to claim 1, wherein the silicide-forming region is a surface layer of the diffusion region and of the gate electrode.

3. The method according to claim 1, wherein the silicide-forming region is an additional silicon layer formed on the diffusion region and on the gate electrode.

4. The method according to claim 1, wherein the additional silicon layer is formed by a process comprising:

forming a silicon film above the entire surface of the semiconductor substrate by chemical vapor-phase deposition subsequent to the formation of the diffusion region and prior to the F implantation;

selectively turning surfaces of the silicon film horizontal to the semiconductor substrate into a carbon-containing silicon layer;

thermally oxidizing the silicon film including the carbon-containing silicon layer; and dipping the thermally oxidized silicon film in a hydrogen fluoride solution and selectively removing the silicon film existing on a vertical plane of the semiconductor substrate to leave the carbon-containing silicon layer selectively on the horizontal plane of the semiconductor substrate.

5. The method according to claim 3, wherein the bottom of the F-containing NiSi layer located on the diffusion regions is positioned flush with or higher than a main surface of the semiconductor substrate.

6. The method according to claim 1, wherein the ion implantation is performed within the range of not more than film thickness of the silicon that can be consumed by the silicide-forming reaction.

7. The method according to claim 1, further comprising depositing a silicon nitride layer on the F-containing NiSi layer.

8. The method according to claim 7, further comprising:

depositing an insulating film on the silicon nitride layer; and forming a contact hole in the insulating film by RIE using the silicon nitride layer as an etching stopper.

9. The method according to claim 1, further comprising:
depositing a metal film on the F-containing NiSi layer; and
heating the semiconductor substrate having the metal film formed thereon at a temperature of 450° C. or more for a period of time, an allowable duration defined as a function of junction depth and temperature by the following formula (A):

$$t_a = Dj^2/\mathrm{Exp}(34.7 - 2.35 \times 10^4/Ta) + 68 \qquad (A)$$

(wherein $t_a$ is the allowable duration (minutes); Dj is the depth (nm) of the position of junction as measured from the bottom of the NiSi layer; and Ta is a heat treatment temperature (K: Kelvin)).

10. The method according to claim 9, wherein the metal includes Ti.

* * * * *